(12) United States Patent
Kageyama

(10) Patent No.: US 12,336,337 B2
(45) Date of Patent: Jun. 17, 2025

(54) LIGHT-EMITTING ELEMENT AND LIGHT-EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 729 days.

(21) Appl. No.: 17/489,392

(22) Filed: Sep. 29, 2021

(65) Prior Publication Data

US 2022/0102587 A1    Mar. 31, 2022

(30) Foreign Application Priority Data

Sep. 30, 2020    (JP) .................................. 2020-165837

(51) Int. Cl.
*H10H 20/831*    (2025.01)
*H10H 20/825*    (2025.01)
*H10H 20/832*    (2025.01)
*H10H 20/84*    (2025.01)
*H10H 20/857*    (2025.01)

(52) U.S. Cl.
CPC ........ *H10H 20/8312* (2025.01); *H10H 20/84* (2025.01); *H10H 20/857* (2025.01); *H10H 20/825* (2025.01); *H10H 20/835* (2025.01)

(58) Field of Classification Search
CPC ....... H01L 33/382; H01L 33/44; H01L 33/62; H01L 33/32; H01L 33/405; H01L 33/54
See application file for complete search history.

(56) References Cited

U.S. PATENT DOCUMENTS

| 2004/0256631 | A1 | 12/2004 | Shin |
| 2011/0297997 | A1 | 12/2011 | Izuka et al. |
| 2013/0065331 | A1 | 3/2013 | Koyama et al. |
| 2014/0319455 | A1 | 10/2014 | Miyachi et al. |
| 2015/0076546 | A1 | 3/2015 | Obata et al. |

(Continued)

FOREIGN PATENT DOCUMENTS

| JP | 2005-019939 A | 1/2005 |
| JP | 2010-027768 A | 2/2010 |

(Continued)

*Primary Examiner* — Donald H B Braswell
*Assistant Examiner* — Sesha Sairaman Srinivasan
(74) *Attorney, Agent, or Firm* — Global IP Counselors, LLP

(57) ABSTRACT

A light-emitting element includes: a semiconductor layered body including first and second semiconductor layers, the first semiconductor layer having a plurality of exposed portions exposed from the second semiconductor layer at locations inward of an outer periphery of the second semiconductor layer; an insulating film covering the semiconductor layered body and defining a first opening above the exposed portions and a second opening above a part of the second semiconductor layer; first and second electrodes electrically connected to the first and second semiconductor layer through the first and second openings, respectively; first bumps and second bumps disposed on the first and second electrodes, respectively. The first electrode and the second electrode have a first surface and a second surface, respectively, that are located at the same height from the second semiconductor layer. The first and second bumps are respectively connected to the first and second surfaces.

20 Claims, 26 Drawing Sheets

(56) References Cited

U.S. PATENT DOCUMENTS

| | | | |
|---|---|---|---|
| 2015/0349207 A1 | 12/2015 | Sogo et al. | |
| 2018/0182929 A1 | 6/2018 | Ozeki et al. | |
| 2018/0198022 A1* | 7/2018 | Sung | H01L 33/382 |
| 2018/0269354 A1 | 9/2018 | Oh et al. | |
| 2019/0006554 A1 | 1/2019 | Kususe et al. | |
| 2019/0097086 A1* | 3/2019 | Shichijo | H10H 20/8312 |
| 2019/0267529 A1* | 8/2019 | Nakai | H01L 33/38 |

FOREIGN PATENT DOCUMENTS

| | | |
|---|---|---|
| JP | 2011-258670 A | 12/2011 |
| JP | 2012-049296 A | 3/2012 |
| JP | 2014-036080 A | 2/2014 |
| JP | 2014-216493 A | 11/2014 |
| JP | 2015-060964 A | 3/2015 |
| JP | 2015-226038 A | 12/2015 |
| JP | 2016-009749 A | 1/2016 |
| JP | 2016-032009 A | 3/2016 |
| JP | 2016-051829 A | 4/2016 |
| JP | 2018-107371 A | 7/2018 |
| JP | 2018-152564 A | 9/2018 |
| JP | 2019-012775 A | 1/2019 |
| JP | 2020-178017 A | 10/2020 |

* cited by examiner

LIGHT-EMITTING ELEMENT AND LIGHT-EMITTING DEVICE

CROSS REFERENCE TO RELATED APPLICATIONS

This application claims priority to Japanese Patent Application No. 2020-165837, filed on Sep. 30, 2020, the entire disclosure of which is hereby incorporated herein by reference.

BACKGROUND

The present disclosure relates to a light-emitting element and a light-emitting device.

A light-emitting device is known in which light-emitting elements are flip-chip mounted with adjustment in heights of bumps (for example, Japanese Unexamined Patent Application Publication No. 201249296, Japanese Unexamined Patent Application Publication No. 2015-60964, and Japanese Unexamined Patent Application Publication No. 2014-36080).

SUMMARY

An object of certain embodiments of the present disclosure is to provide a light-emitting element with good mountability when flip-chip mounted and a light-emitting device employing the light-emitting element.

An embodiment of the present disclosure includes:

(1) A light-emitting element includes a semiconductor layered body, an insulating film, a first electrode, a second electrode, a plurality of first bumps, and a plurality of second bumps. The semiconductor layered body includes a first semiconductor layer, a second semiconductor layer, and an active layer between the first semiconductor layer and the second semiconductor layer. The first semiconductor layer has a plurality of exposed portions exposed from the second semiconductor layer and the active layer at locations inward of an outer periphery of the second semiconductor layer in a plan view from a side of the second semiconductor layer. The insulating film covers the semiconductor layered body and defines at least one first opening above one of the exposed portions and at least one second opening above a part of the second semiconductor layer. The first electrode is electrically connected to the first semiconductor layer through the first opening and partially located above the second semiconductor layer via the insulating film. The second electrode is electrically connected to the second semiconductor layer through the at least one second opening and partially located above the second semiconductor layer via the insulating film. The first bumps are on the first electrode. The second bumps are on the second electrode. The first electrode has a first surface and the second electrode has a second surface above the insulating film disposed above the second semiconductor layer. The first surface and the second surface are located at a same height from the second semiconductor layer. The first bumps are connected to the first surface, and the second bumps are connected to the second surface.

(2) A light-emitting device includes a substrate and a light emitting element. The substrate has an upper surface and includes a first wiring and a second wiring that are disposed on the upper surface. The light-emitting element includes a semiconductor layered body including a first semiconductor layer, a second semiconductor layer, and an active layer between the first semiconductor layer and the second semiconductor layer, the first semiconductor layer having a plurality of exposed portions exposed from the second semiconductor layer and the active layer at locations inward of an outer periphery of the second semiconductor layer in a plan view from a side of the second semiconductor layer, an insulating film covering the semiconductor layered body and defining a plurality of first openings respectively over the exposed portions and at least one second opening over a part of the second semiconductor layer, a first electrode electrically connected to the first semiconductor layer through the first openings and partially disposed above the second semiconductor layer via the insulating film, and a second electrode electrically connected to the second semiconductor layer through the at least one second opening and partially disposed above the second semiconductor layer via the insulating film, wherein the first electrode has a first surface and the second electrode has a second surface above the insulating film disposed above the second semiconductor layer, the first surface and the second surface being located at a same height from the second semiconductor layer. The light emitting element is flip-chip mounted on the substrate via a plurality of first bumps connecting the first surface of the first electrode and the first wiring of the substrate, and a plurality of second bumps connecting the second surface of the second electrode and the second wiring of the substrate.

According to certain embodiments of the present disclosure, a light-emitting element with good mountability for flip-chip mounting and a light-emitting device can be obtained.

DETAILED DESCRIPTION OF EMBODIMENTS

Figure 1A:
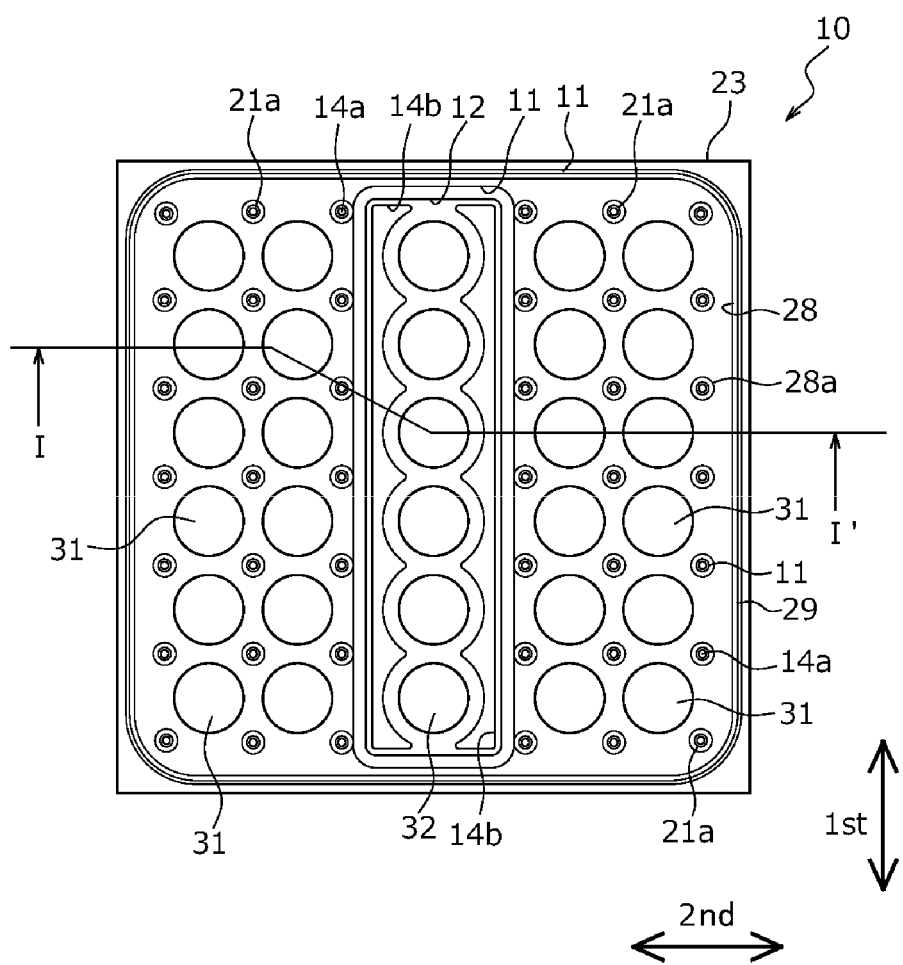
FIG. 1A is a schematic plan view of an embodiment of a light-emitting element of the present disclosure.

Certain embodiments of the present disclosure will be described with reference to the accompanying drawings. The embodiments described below are intended to describe examples to give a concrete form to the technical idea of the present invention and are not intended to limit the present invention to the description below. Sizes or positional relationships of members illustrated in each drawing may be exaggerated in order to clarify the descriptions. The cross-sectional views may be cross-sectional end views showing only cross sections of members. Further, the same term or the same reference numeral generally represents the same member or members made of the same material, and its repetitive descriptions will be omitted as appropriate. A member in an embodiment designated as the same name as in another embodiment indicates the same or corresponding member. A material, size, and the like of such a member may be the same as such another embodiment unless otherwise described. The terms "part" in the present specification may refer to a portion of a single member or one or more members among a plurality of members, and the terms "all" and "whole" may refer to the whole of a single member or all of a plurality of members. Terms such as "up/upper" and "down/lower" in the present specification are not intended to represent absolute positions unless otherwise specified but represent relative positions between components in drawings referred to for the purpose of illustration. The term "cover" in the embodiments includes not only covering in direct contact but also includes indirect covering, such as covering via another member therebetween.

Light-Emitting Element

Figure 1B:
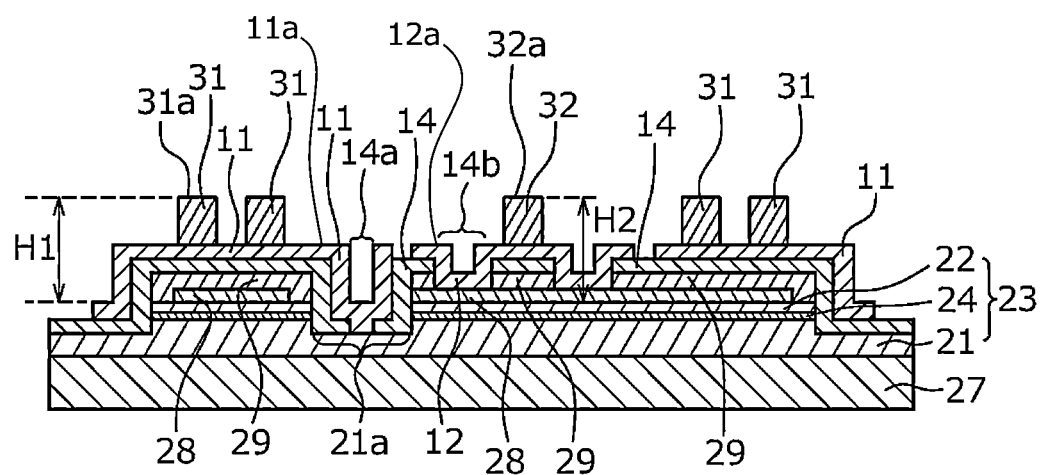
FIG. 1B is a schematic cross-sectional view taken along line I-I' of FIG. 1A.

A light-emitting element 10 in the present embodiment includes a supporting substrate 27, a semiconductor layered body 23, an insulating film 14, a first electrode 11, a second electrode 12, first bumps 31, and second bumps 32 as shown in FIGS. 1A and 1B.

The semiconductor layered body 23 includes a first semiconductor layer 21, a second semiconductor layer 22, and an active layer 24 between the first semiconductor layer 21 and the second semiconductor layer 22, the first semiconductor layer 21 having a plurality of exposed portions 21a exposed from the second semiconductor layer 22 and the active layer 24 (i.e., the exposed portions are not covered by the active layer 24 or the second semiconductor layer 22), the plurality of exposed portions 21a located inward of an outer periphery of the second semiconductor layer 22.

The insulating film 14 covers an upper surface (that is, a surface on the second semiconductor layer 22 side) of the semiconductor layered body 23 and defines first openings 14a above the exposed portions 21a and second openings 14b above a portion of the second semiconductor layer 22.

The first electrode 11 is electrically connected to the first semiconductor layer 21 through the first openings 14a and partially located on the second semiconductor layer 22 via the insulating film 14. The second electrode 12 is electrically connected to the second semiconductor layer 22 through the second openings 14b and partially located on the second semiconductor layer 22 via the insulating film 14. The first electrode 11 and the second electrode 12 have a first surface 11a and a second surface 12a, respectively, above the insulating film 14 above the second semiconductor layer 22, the first surface 11a and the second surface 12a located at the same height from the second semiconductor layer 22.

A plurality of first bumps 31 are disposed on the first electrode 11. A plurality of second bumps 32 are disposed on the second electrode 12. The first bumps 31 and the second bumps 32 are respectively connected to the first surface 11a and the second surface 12a.

That is, in the light-emitting element 10, the first electrode 11 extends between insides of the first openings 14a used for electrical connections to the first semiconductor layer and the insulating film 14 above the second semiconductor layer 22, and the second electrode 12 extends between insides of the second openings 14b used for electrical connections to the second semiconductor layer and the insulating film 14 above the second semiconductor layer 22, such that the first surface 11a and the second surface 12a located at the same height are located above the insulating film 14 above the second semiconductor layer 22. The first bumps 31 are connected to the first surface 11a, and the second bumps 32 are connected to the second surface 12a.

In the light-emitting element having such a structure, of the surfaces of the first bumps 31 and the second bumps 32 respectively connected to the first surface 11a and the second surface 12a can be located at substantially the same height (that is, the heights from the lower surface of the light-emitting element to upper surfaces 31a and 32a of the bumps). This structure allows for reducing inclination due to the difference in height between the first electrode and the second electrode on the mounting surface of the light-emitting element at the time of flip-chip mounting. Accordingly, substantially the same amount of load is experienced on the first bumps and the second bumps when the light-emitting element is flip-chip mounted, which allows for reducing imbalances in loads experienced on the first electrode and the second electrode and also loads experienced on the first semiconductor layer and the second semiconductor layer at the time of mounting. Stable flip-chip mounting can thus be performed.

Also, the first bumps 31 and the second bumps 32 with no difference in height can be formed under the same conditions at once in the manufacturing. This can simplify manufacturing. For example, when forming bumps under the same conditions on electrodes with a difference in height, the obtained bumps have a difference in height of respective upper surfaces, which necessitates a step of adjusting the bump heights, such as polishing, in order to reduce the inclination described above. Such a step can be omitted in the present embodiment.

Examples of the planar shape of the light-emitting element 10 and/or the semiconductor layered body include rectangular shapes. The planar shape may be a polygonal shape such as a triangular shape or a hexagonal shape, a shape with rounded corners, a circular shape, or an elliptic shape. The term "rectangular shape" as used in the present specification includes variations in the angles of the four corners of 90°±5° are acceptable and includes an approximate rectangle such as rectangles with chamfered or rounded corners. The term "rectangular shape" includes a "square shape."

Semiconductor Layered Body 23

The semiconductor layered body 23 includes the first semiconductor layer 21 (such as an n-type semiconductor layer), the active layer 24, and the second semiconductor layer 22 (such as a p-type semiconductor layer) layered on the supporting substrate 27. The supporting substrate 27 may have been removed when in the form of the light-emitting element 10. The second semiconductor layer 22 is preferably disposed inward of the outer periphery of the first semiconductor layer 21 in a plan view from the second semiconductor layer 22 side. That is, it is preferable that, in a plan view from the second semiconductor layer side, neither the second semiconductor layer 22 nor the active layer 24 is located in the outer peripheral portion of the semiconductor layered body 23 and the first semiconductor layer 21 exposed in the outer peripheral portion of the semiconductor layered body 23. Further, it is preferable that the outer edges of the second semiconductor layer 22 substantially coincide with the outer edges of the active layer 24 and that the outer edges of the first semiconductor layer substantially coincide with the outer edges of the semiconductor layered body 23 in a plan view from the second semiconductor layer 22 side.

Examples of the first semiconductor layer, the active layer, and the second semiconductor layer include various semiconductors such as Groups III-V compound semiconductors and Group II-VI compound semiconductors. The specific examples include nitride semiconductor materials represented by $In_xAl_yGa_{1-X-Y}N$ ($0 \leq X$, $0 \leq Y$, and $X+Y \leq 1$), such as InN, AlN, GaN, InGaN, AlGaN, and InGaAlN. Each layer can have a thickness and layer structure known in the art.

Supporting Substrate 27

Examples of the supporting substrate 27 include a growth substrate for semiconductor layers, such as a substrate on which semiconductor layers can be epitaxially grown. Examples of the material for such a growth substrate include insulating substrates such as sapphire ($Al_2O_3$) and spinel ($MgAl_2O_4$) substrates.

Exposed Portion 21a

The semiconductor layered body 23 includes, at locations inward of the outer periphery of the second semiconductor layer 22, a plurality of exposed portions 21a in which the second semiconductor layer 22 and the active layer 24 have been removed entirely in the thickness direction such that the first semiconductor layer 21 is exposed from the second semiconductor layer 22 and the active layer 24. In other words, the upper surface of the second semiconductor layer 22 of the semiconductor layered body 23 defines recesses passing through the second semiconductor layer 22 and the active layer 24 to reach the first semiconductor layer 21. The recesses are each defined by a base surface and a lateral surface surrounding the base surface. The first semiconductor layer 21 is exposed in the base surface defining the recess as the exposed portion 21a. The second semiconductor layer 22, the active layer 24, and the first semiconductor layer 21 are located in the lateral surface of the recess in the order from the opening toward the base surface defining the recess.

The shape, size, positions, and number of the exposed portions can be appropriately determined according to the size, shape, electrode pattern, and other factors of the light-emitting element to be obtained. For example, all the exposed portions 21a may have the same shape and size, or all or part of the exposed portions 21a may have different shapes and sizes. It is preferable that all the exposed portions 21a have substantially the same size and shape. Because the exposed portions 21a do not have the active layer 24, regularly arraying the exposed portions 21a of substantially the same size allows for reducing reduction in the emission area and unevenness in emission regions.

It is preferable that the exposed portions are regularly arranged inward of the outer periphery of the second semiconductor layer in a plan view from the second semiconductor layer side. In particular, when the semiconductor layered body 23 has a rectangular shape in a top view (that is, in a plan view from the second semiconductor layer side), the exposed portions are preferably arranged regularly along a first direction parallel to a side of the rectangle. It is more preferable that a plurality of rows of the exposed portions along the first direction be arranged parallel to one another. With the exposed portions 21a regularly arranged spaced apart from one another, unevenness in the current density distribution can be reduced.

Examples of the shape of the exposed portions 21a in a plan view include circular shapes, elliptic shapes, and polygonal shapes such as triangular shapes, quadrangular shapes, and hexagonal shapes. Among these shapes, circular shapes or near-circular shapes (such as elliptic shapes and polygonal shapes with six or more vertices) are preferable. The size of the exposed portions can be appropriately adjusted according to the size of the semiconductor layered body, the desired light output of the light-emitting element, and the like. For example, the exposed portions preferably have a diameter of about several tens of micrometers to several hundred micrometers. The exposed portions preferably have a diameter of about 1/20 to 1/5 of a side of the semiconductor layered body.

The total planar area of the exposed portions located inward of the outer periphery of the second semiconductor layer is preferably 30% or less, 25% or less, 20% or less, 18% or less, or 15% or less of the planar area of the inside of the outer periphery of the second semiconductor layer. With such ranges and regular arrangement of the exposed portions, unevenness in the current density distribution can be reduced while reducing a decrease in the light output due to a decrease in the emission area.

Insulating Film 14

The insulating film 14 covers a surface of the semiconductor layered body 23 at the second semiconductor layer 22 side. The insulating film 14 defines the first openings 14a and the second openings 14b. The first semiconductor layer 21 is exposed from the insulating film in the first openings 14a, and the second semiconductor layer is exposed from the insulating film in the second openings 14b.

Figure 1C:
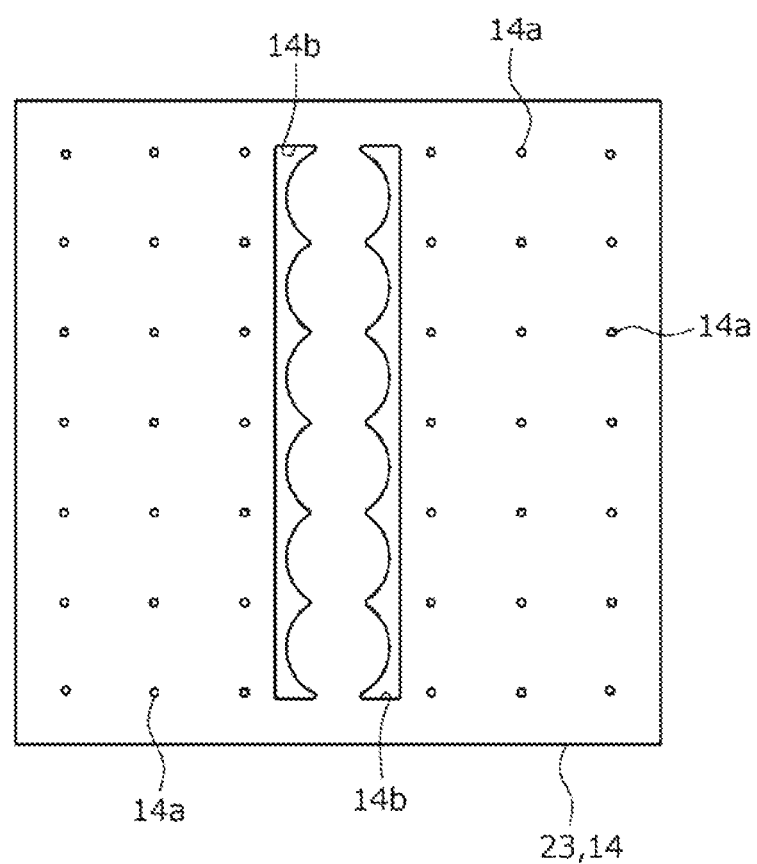
FIG. 1C is a schematic plan view for illustrating the shape of an insulating film of the light-emitting element in FIG. 1A.

That is, the insulating film 14 covers the surface of the semiconductor layered body 23 at the second semiconductor layer side and defines the first openings 14a over the exposed portions 21a and the second openings 14b over partial regions of the second semiconductor layer 22 as shown in FIG. 1C. Part of the first openings 14a may be located over the first semiconductor layer 21 exposed on the outer peripheral portion of the semiconductor layered body 23.

The insulating film 14 covers the semiconductor layered body 23 and defines the first openings 14a with the exposed portions 21a. This structure allows the first electrode 11 to be disposed over a wide region of the upper surface of the insulating film 14. The first openings 14a preferably has a size smaller than that of the exposed portions 21a, and it is more preferable that the first openings 14a and the exposed portions 21a be arranged in the same number and in a similar shape. That is, the insulating film 14 preferably covers the lateral surfaces defining the recesses defining the exposed portions 21a, more preferably also covers outer peripheral portions of the exposed portions 21a near the lateral surfaces, and defines the first openings 14a directly above central portions of the exposed portions 21a. That is, the insulating film 14 preferably covers the lateral surfaces of the second semiconductor layer 22 and the lateral surfaces of the active layers 24 surrounding the exposed portions 21a. This structure allows the first electrode 11 to be electrically connected only to the first semiconductor layer 21 in the first openings 14a, so that a short circuit between the second semiconductor layer 22 and the active layer 24 can be prevented.

It is not necessary that all the first openings 14a has the same size and/or shape. When the semiconductor layered body 23 has a rectangular shape in a top view, the first openings 14a are preferably arranged along the first direction parallel to a side of the rectangle. The opening areas of the first openings 14a can be appropriately determined according to the size of the semiconductor layered body, the desired light output of the light-emitting element, and the like. For example, the total opening area of the first openings 14a is preferably 0.1% to 1.5%, more preferably 0.3% to 0.5%, of the planar area of the semiconductor layered body.

As long as the second openings 14b do not overlap (that is, not overlap in a plan view) with the exposed portions 21a, the second openings 14b may be defined in any appropriate number, shape, and size. When defining a plurality of second openings 14b, part or all of the second openings 14b may have the same shape and size or may have different shapes and sizes. The second openings 14b can have, for example, a circular shape, an elliptic shape, a polygonal shape such as a triangular shape, a quadrangular shape, or a hexagonal shape, or a combination of two or more of these shapes.

For example, when the semiconductor layered body 23 has a rectangular shape in a top view and the second electrode has a shape that is longer in the first direction parallel to a side of the rectangular shape than in the second direction perpendicular to the first direction, the second openings 14b are preferably longer in the first direction. Further, part or all of the second openings 14b are preferably arranged along the outer edge of the second electrode 12, the outer edge being close to the first electrode 11 to be described below. With the second bumps that are not disposed in the second openings 14b, defining the second openings 14b on the first electrode 11 side allows for securing the distances between the second bumps disposed on the second electrode and the first bumps disposed on the first electrode. The term "part" as used herein may refer to a portion of a single second opening 14b or some of the second openings 14b. The term "all" may refer to the whole of a single second opening 14b or all the second openings 14b.

The opening areas of the second openings 14b can be appropriately determined according to the size of the semiconductor layered body, the desired light output of the light-emitting element, and the like. For example, the total opening area of the second openings 14b is preferably 3% to 10%, more preferably 4% to 6%, of the planar area of the semiconductor layered body.

The total opening area of the first openings 14a is preferably smaller than the total opening area of the second openings 14b. For example, the total opening area of the first openings 14a is preferably 5% to 25%, more preferably 8% to 15%, of the total opening area of the second openings 14b.

In the case in which the second semiconductor layer is disposed inward of the outer periphery of the first semiconductor layer in a plan view from the second semiconductor layer side as described above, part or the whole of the first semiconductor layer exposed on the outer peripheral portion of the semiconductor layered body may be covered with the insulating film 14.

The insulating film 14 is formed of a material known in the art and has a thickness that allows for having electrical insulation. More specifically, for the insulating film 14, a metal oxide or a metal nitride can be used, and, for example, at least one of oxides and nitrides of substances selected from the group consisting of Si, Ti, Zr, Nb, Ta, or Al can be preferably used. The insulating film 14 can be formed by sputtering, vapor deposition, or the like.

First Electrode 11 and Second Electrode 12

Figure 1D:
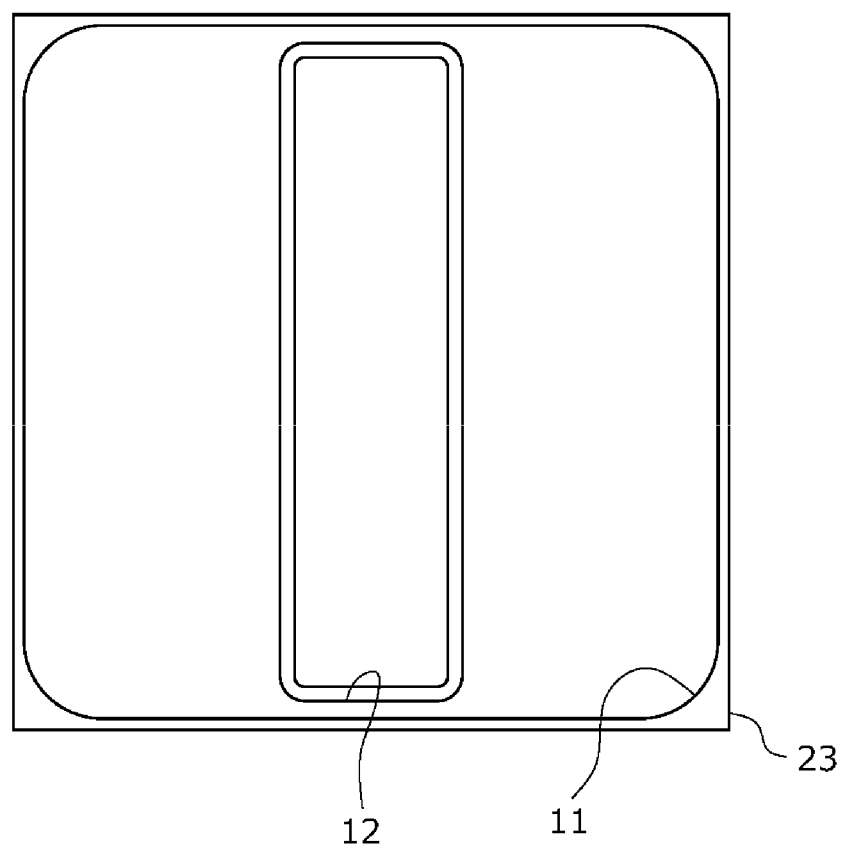
FIG. 1D is a schematic plan view for illustrating the shapes of a first electrode and a second electrode of the light-emitting element in FIG. 1A.

The first electrode 11 and the second electrode 12 are located on the upper surface side (that is, the second semiconductor layer 22 side opposite to the supporting substrate) of the semiconductor layered body 23 as shown in FIG. 1D. The first electrode 11 and the second electrode 12 are electrically connected respectively to the first semiconductor layer 21 and the second semiconductor layer 22 through the first openings 14a and the second openings 14b. The first semiconductor layer 21 and the first electrode 11, and the second semiconductor layer 22 and the second electrode 12 may be in direct contact with each other or may be electrically connected via an electroconductive layer such as a light-reflective electrode 28 described below. The first electrode 11 preferably covers all or part of the first openings 14a integrally, more preferably covers all the first openings 14a integrally. The second electrode 12 preferably covers all or part of the second openings 14b integrally, more preferably covers all the second openings 14b integrally.

In the case in which the second semiconductor layer 22 is disposed inward of the outer periphery of the first semiconductor layer 21 in a plan view from the second semiconductor layer side as described above, it is preferable that the first electrode 11 be electrically connected to the first semiconductor layer 21 exposed from the insulating film 14 at locations outward of the outer periphery of the second semiconductor layer 22 in the plan view.

The first electrode 11 and the second electrode 12 can be formed by sputtering, vapor deposition, or the like.

For example, each of the first electrode 11 and the second electrode 12 can be formed of a single-layer film or a layered film made of metals such as Au, Pt, Pd, Rh, Ni, W, Mo, Cr, Ti, Al, and Cu or alloys of these metals. More specifically, each of the first electrode 11 and the second electrode 12 can be formed of a layered film of Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, or Ti/Rh layered in this order from the semiconductor layer side. The first electrode 11 and the second electrode 12 may not be formed of the same material but are preferably formed of the same material in view of simplification of the manufacturing. The thicknesses of the first electrode 11 and the second electrode 12 can be appropriately set to a thickness of a film used in the art. In this case, the first electrode 11 and the second electrode 12 may not have the same thickness but preferably have the same thickness. In particular, the first electrode 11 and the second electrode 12 both have regions located above the second semiconductor layer 22 via the insulating film 14. It is preferable that the thicknesses of the first electrode 11 and the second electrode 12 be determined such that the first surface 11a and the second surface 12a at least in such regions are located at the same height from the second semiconductor layer 22. Alternatively, when the light-reflective electrode 28 and a protective layer 29 are disposed over the second semiconductor layer 22 as will be described below, the first electrode 11 and the second electrode 12 are preferably disposed such that the first surface 11a and the second surface 12a are located at the same height from the second semiconductor layer 22 in consideration of the thicknesses of the light-reflective electrode 28 and the protective layer 29 and the regions occupied by the light-reflective electrode 28 and the protective layer 29. The first surface 11a and the second surface 12a are both regions in which the first bumps and the second bumps that will be described below are to be formed, and it is preferable to appropriately determine the sizes, shapes, arrangement, and the like in consideration of a voltage applied to the light-emitting element and the like. For example, the first surface 11a and the second surface 12a are preferably disposed in regions without the exposed portions 21a.

The shapes of the first electrode 11 and the second electrode 12 can be appropriately determined. For example, the overall planar shape of the first electrode 11 and the second electrode 12 is preferably substantially the same as the planar shape of the semiconductor layered body 23. For example, the first electrode 11 and the second electrode 12 may be arranged in parallel in the first direction parallel to a side of the rectangular semiconductor layered body 23 in a plan view, or the second electrode 12 may be disposed between the first electrodes 11 or vice versa.

The first electrode 11 is electrically connected to the exposed portions 21a located on the second semiconductor layer 22 side of the semiconductor layered body 23, described above, through the first openings 14a. In this case, the first electrode 11 is preferably connected to a plurality of exposed portions 21a to collectively cover the exposed portions 21a, more preferably integrally connected to all the exposed portions 21a. The first electrode 11 is disposed not only over the exposed portions 21a (that is, the first semiconductor layer 21) but also above the second semiconductor layer 22. The first electrode 11 covers the lateral surfaces of the second semiconductor layer 22 and the active layer 24, which define the exposed portions 21a, in the first openings 14a via the insulating film 14.

The second electrode 12 is disposed in a region without the exposed portions 21a, that is, over the second semiconductor layer 22, and is electrically connected to the second semiconductor layer 22 through the second openings 14b. The second electrode 12 may be in direct contact with the second semiconductor layer 22 but is preferably disposed on the second semiconductor layer 22 with an electroconductive layer such as the light-reflective electrode described below therebetween.

First Bump 31 and Second Bump 32

A plurality of first bumps 31 are disposed on the first electrode 11. A plurality of second bumps 32 are disposed on the second electrode 12. The first bumps 31 and the second bumps 32 are disposed on the first surface 11a and the second surface 12a described above, respectively, and are respectively connected to the first electrode 11 and the second electrode 12.

The first bumps 31 and the second bumps 32 preferably have the same thickness. With this structure, when the light-emitting element is flip-mounted on wirings on the substrate, which will be described below, the bumps can have approximately the same bonding strength. Further, the inclination of the light-emitting element can be avoided, which allows for facilitating adjustment of the optical axis with respect to the substrate.

The shapes, sizes, and numbers of the first bumps 31 and the second bumps 32 can all be appropriately determined as long as the first bumps 31 and the second bumps 32 can be disposed on the first surface 11a and the second surface 12a. For example, the first bumps 31 and the second bumps 32 can have a circular shape, an elliptic shape, or a polygonal shape such as a triangular shape, a quadrilateral shape, or a hexagonal shape in a plan view. Among these shapes, a circular shape or a near-circular shape (such as elliptic shapes or polygonal shapes with six or more vertices) is preferable. The size of the first bumps 31 and the second bumps 32 can be appropriately adjusted according to the size of the semiconductor layered body, the desired light output of the light-emitting element, and the like. For example, the first bumps 31 and the second bumps 32 can have a diameter in a range of about several tens of micrometers to several hundred micrometers. The diameter can be, for example, in a range of about 1/20 to 1/5 of a side of the semiconductor layered body. All or part of the first bumps 31 and the second bumps 32 may have the same shape and/or size or may have different shapes and/or sizes. All or part of the first bumps 31 may have the same shape and/or size as or may have different shapes and/or sizes from the second bumps 32. The number of the first bumps 31 may be equal to or different from the number of the second bumps 32.

The first bumps 31 and the second bumps 32 are used for flip-mounting the light-emitting element on the wiring on the substrate described below. The first bumps 31 and the second bumps 32 can be disposed at any appropriate positions on the first surface 11a of the first electrode 11 and the second surface 12a of the second electrode 12. For example, the first bumps 31 and the second bumps 32 are preferably disposed evenly with respect to a surface of the semiconductor layered body as a whole. It is preferable that the first bumps 31 and the second bumps 32 are connected to the first surface and the second surface, respectively, with respective regularities at substantially uniform intervals. Such an arrangement allows the first bumps 31 and the second bumps 32 to be densely arranged without overlapping with the exposed portions in a plan view. This allows for supplying a sufficient current to the light-emitting element and dispersing the density of the supplied current, so that unevenness in the current density distribution can be reduced. Further, unevenness in the heat dissipation performance in a plane of the light-emitting element can be reduced. Furthermore, the load experienced at the time of bonding to the substrate can be reduced, which can reduce variations in the degree of flattening of the bumps after the bonding. The inclination of the light-emitting element can also be avoided, which allows for facilitating adjustment in the optical axis with respect to the substrate.

For example, the first bumps 31 and the second bumps 32 can be formed of Au, Ag, Cu, Al, Sn, Pt, Zn, Ni, or an alloy of these metals and, for example, can be stud bumps known in the art. Stud bumps can be formed using a stud bump bonder or a wire bonder. The first bumps 31 and the second bumps 32 can be formed using a method known in the art, such as electroplating, electroless plating, vapor deposition, and sputtering.

Light-Reflective Electrode 28

The light-emitting element 10 may include the light-reflective electrode 28 between the second electrode 12 and the second semiconductor layer 22. The light-reflective electrode 28 covers the upper surface of the second semiconductor layer 22 as shown in FIG. 1A and FIG. 1B.

Figure 1E:
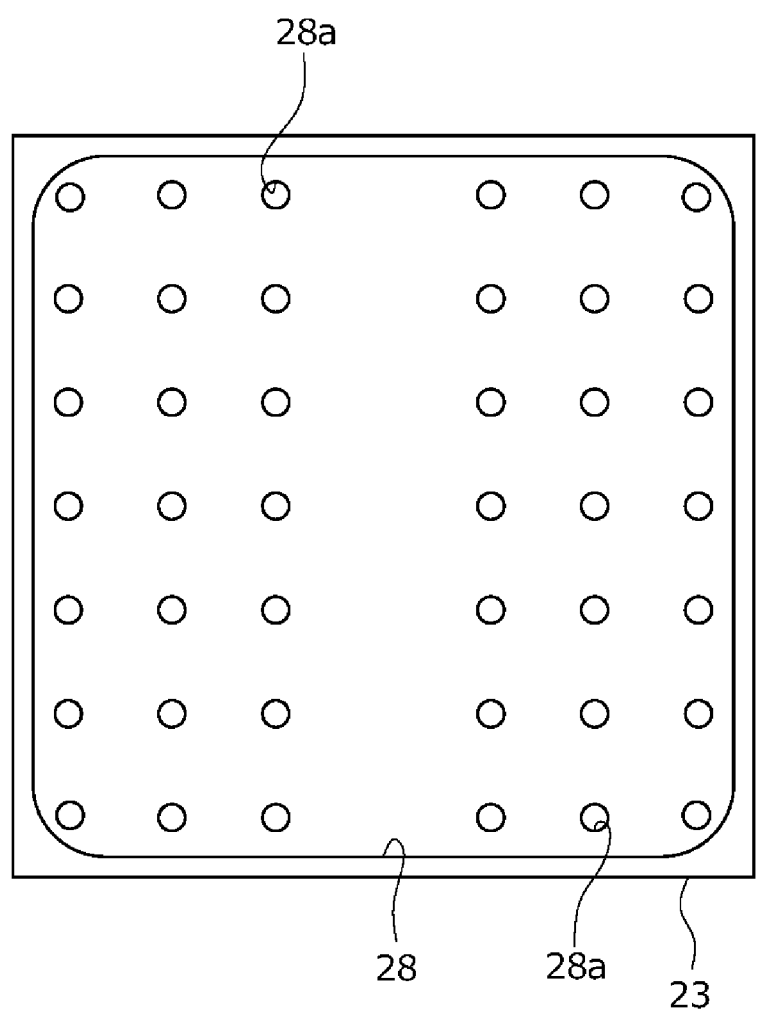
FIG. 1E is a schematic plan view for illustrating the shape of a light-reflective electrode of the light-emitting element in FIG. 1A.

For example, the light-reflective electrode 28 defines holes 28a above respective exposed portions 21a as shown in FIG. 1A and FIG. 1E. The holes 28a are through holes formed at positions corresponding to the exposed portions 21a such that the light-reflective electrode 28 does not cover the exposed portions 21a. The holes 28a preferably have the same size and shape as the exposed portions 21a or slightly larger than the exposed portions 21a to surrounding the exposed portions 21a in a plan view. The light-reflective electrode 28 is electrically connected to the second electrode 12 and the second semiconductor layer 22 and is therefore not in contact with the first semiconductor layer 21 including the exposed portions 21a.

An electroconductive and light-reflective metal material can be used for the light-reflective electrode 28. For example, Ag, Al, Ti, Pt, or an alloy mainly composed of any of these metals can be used. Among these materials, Ag or an Ag alloy that is reflective to light emitted from the active layer is more preferable. The light-reflective electrode 28 preferably has a thickness large enough to effectively reflect light emitted from the active layer, and the thickness can be in a range of about 20 nm to 1 µm. The greater the contact area between the light-reflective electrode and the second semiconductor layer, the more preferable, and accordingly the light-reflective electrode 28 is preferably disposed also at positions on the second semiconductor layer 22 above which the first electrode 11 is disposed. More specifically, for example, the total planar area of the light-reflective electrode 28 is 50% or more, 60% or more, or 70% or more of the planar ara of the semiconductor layered body.

When the light-reflective electrode 28 contains Ag, the protective layer 29 is preferably disposed over the second semiconductor layer 22 to prevent Ag migration, such that the protective layer 29 covers the upper surface, preferably the entire upper and lateral surfaces, of the light-reflective electrode 28.

More specifically, the light-reflective electrode 28 covers the second semiconductor layer 22 with spacing apart from the outer peripheral end of the second semiconductor layer 22 and opening ends of recesses defining the exposed portions 21a. The protective layer 29 covers the whole upper surface of the second semiconductor layer 22 including the outer peripheral end of the second semiconductor layer 22 and the opening ends of the recesses defining the exposed portions 21a. The protective layer 29 can thus cover the whole surfaces of the light-reflective electrode 28 including the lateral surfaces of the light-reflective electrode 28.

For the protective layer 29, an electroconductive member such as metals, alloys, or the like generally used as electrode materials may be used, or an insulating member may be used. Examples of the electroconductive member include single-layer films and layered films containing metals such as Al, Cu, and Ni. Examples of the insulating member include materials of the insulating film 14 described above, and SiN is preferable among the materials. SiN forms a dense film, and thus greatly prevents entry of water. For example, the thickness of the protective layer 29 is in a range of about several hundred nanometers to several micrometers to effectively reduce silver migration.

In the case in which the protective layer 29 is formed of an insulating member, the protective layer 29 preferably defines openings passing through the protective layer 29 at positions on or above the light-reflective electrode 28 that correspond to the second openings 14b of the insulating film 14. The second semiconductor layer 22 can thus be electrically connected to the second electrode 12 through the second openings via the light-reflective electrode 28. In this case, the entire exposed surfaces of the light-reflective electrode 28 exposed from the protective layer 29 are preferably covered with the second electrode 12.

The light-reflective electrode and the protective layer can be formed by sputtering, vapor deposition, or the like.

Light-Emitting Device

Figure 7A:
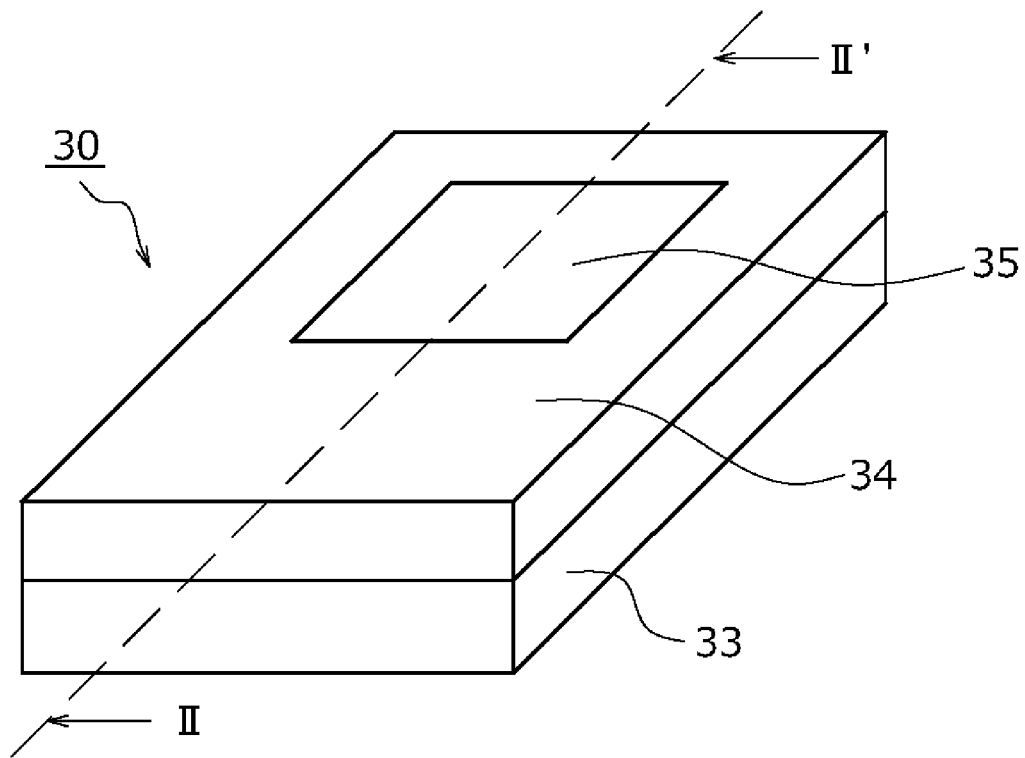
FIG. 7A is a schematic perspective view of an embodiment of a light-emitting device of the present disclosure.
Figure 7B:
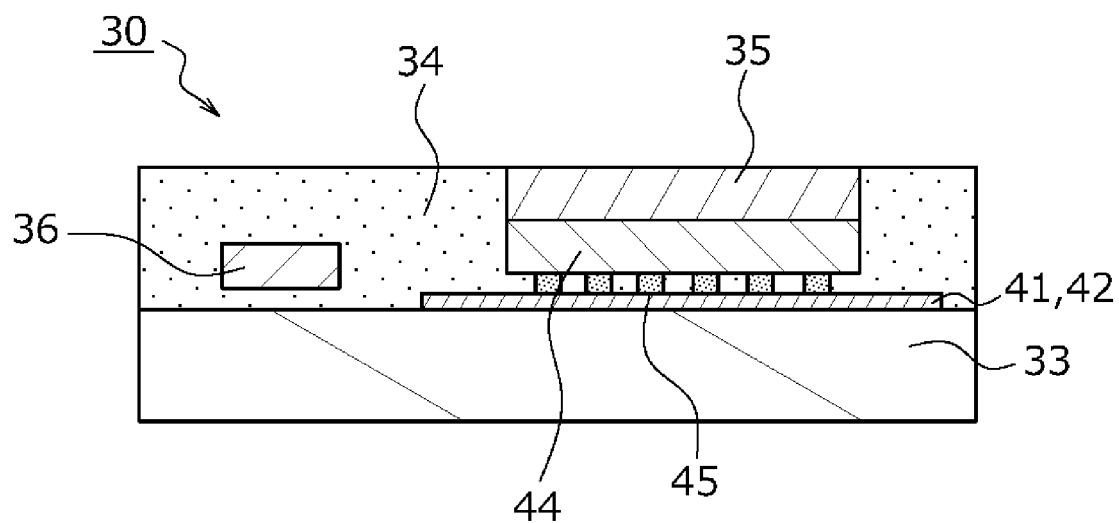
FIG. 7B is a schematic end view taken along line II-II' of FIG. 7A.

A light-emitting device 30 according to the present embodiment includes a substrate 33, a light-emitting element 44, and a plurality of bumps 45 as shown in FIGS. 7A and 7B. The bumps 45 include first bumps and second bumps. The light-emitting element 44 is flip-chip mounted on the substrate 33 via the first bumps and the second bumps.

Light-emitting elements 10 and 10A to 10E and the like described above or below may be employed for the light-emitting element 44 and the bumps 45 in the example herein. The bumps 45 may be bumps disposed on the substrate 33 separately from the light-emitting element. In this case, the light-emitting element preferably has substantially the same structure as that of the light-emitting elements 10 and 10A to 10E and the like described above or below except that the first bumps and the second bumps are not included. The bumps 45 may have substantially the same structure as the first bumps and the second bumps, described above, disposed on the light-emitting element. That is, the bumps 45 disposed on the substrate 33 are connected to the first surface of the first electrode and the second surface of the second electrode above the insulating film over the second semiconductor layer of the light-emitting element as described above, the first surface and the second surface being located at the same height from the second semiconductor layer.

The light-emitting device 30 may further include a covering member 34. A light-transmissive member 35 is preferably disposed on the light-emitting element 44.

Substrate 33

The substrate 33 includes first wiring 41 and second wiring 42 on the upper surface.

Examples of a material of the substrate 33 include insulating members such as glass epoxy, resins, and ceramics, and metal members provided with insulating members on surfaces of the metal members. Among these materials, a material containing a ceramic, which is resistant to heat and weathering, is preferable for the substrate. Examples of a ceramic material include aluminum oxide and aluminum nitride.

Any appropriate wiring that can supply current to the light-emitting element can be used for the first wiring 41 and the second wiring 42 with materials, thickness, and shapes that are generally employed in the art. More specifically, for example, the first wiring 41 and the second wiring 42 can be formed of a metal such as Cu, Al, Au, Ag, Pt, Ti, W, Pd, Fe, and Ni or an alloy containing two or more of these metals. In order to efficiently extract light from the light-emitting element 10, respective outermost surfaces of the first wiring 41 and the second wiring 42 disposed on the upper surface of the substrate 33 are preferably covered with a material having a high reflectance such as silver or gold. The first wiring 41 and the second wiring 42 can be formed by electroplating, electroless plating, vapor deposition, sputtering, or the like. For example, in the case in which Au bumps are used as the bumps 45, employing Au for the outermost surfaces of the first wiring 41 and the second wiring 42 can improve bondability between the light-emitting element and the substrate.

The first wiring 41 and the second wiring 42 are preferably disposed on the upper surface of the substrate 33 to serve as positive and negative patterns. With the first wiring 41 and the second wiring 42 having such a structure, the first electrode electrically connected to the first semiconductor layer and the second electrode electrically connected to the second semiconductor layer in the light-emitting element described below can be connected to the first wiring 41 and the second wiring 42, respectively, via the bumps 45 by flip-chip mounting. The first wiring 41 and the second wiring 42 may be disposed not only over the upper surface of the substrate 33 but also over the lower surface through the inside and/or the lateral surfaces of the substrate 33. The first wiring and the second wiring disposed over the lower surface can be used as external connecting terminals for supplying a current from the outside. The substrate 33 may include, in addition to the first wiring 41 and the second wiring 42 connected to the light-emitting element, wiring for securing heat dissipation performance and/or wiring for driving another electronic component such as a protective element.

Covering Member 34

The covering member 34 is an insulating member covering part or all of the light-emitting element 44, the bumps 45 including the first bumps and the second bumps, and the upper surface of the substrate 33 as shown in FIG. 7B. The covering member 34 preferably covers all of the lateral surfaces of the light-emitting element 44, a region between the light-emitting element 44 and the substrate 33, and the lateral surfaces of the bumps 45 on the upper surface of the substrate 33.

For example, the covering member 34 can be formed of a light-reflective, light-transmissive, or light-shielding material. For example, a resin containing a light-reflective substance, a phosphor, a diffusing material, a colorant, etc., can be used. Among these properties, the covering member preferably has light-reflective and/or light-shielding properties. Any appropriate materials generally used in the art can be used for the resin, the light-reflective substance, and the like constituting the covering member.

Examples of the resin include a resin or hybrid resin containing at least one of a silicone resin, a modified silicone resin, an epoxy resin, a modified epoxy resin, an acrylic resin, a phenolic resin, or a fluorocarbon resin. Examples of the light-reflective substance include titanium oxide, silicon oxide, zirconium oxide, potassium titanate, aluminum oxide, aluminum nitride, boron nitride, and mullite.

The material constituting the covering member 34 preferably contains a resin, which is highly fluid and is cured by application of heat or light, in view of ease of entering the gap between the light-emitting element and the substrate and prevention of formation of voids. Examples of such a material include a material that has a fluidity at a viscosity of 0.5 Pa·s to 30 Pa·s. The amounts of reflection and transmission of light can be adjusted by adjusting the content of the light-reflective substance or the like in the material constituting the covering member 34. For example, the covering member preferably contains 20 wt % or more of the light-reflective substance.

The covering member 34 can be formed by, for example, injection molding, potting, printing, transfer molding, or compression molding.

Light-Transmissive Member 35

The light-emitting device 30 includes the light-transmissive member 35 on the light-emitting element 10. The light-emitting element 10 is flip-chip mounted on the first wiring 41 and the second wiring 42 such that a surface of light-emitting element 10 provided with the first electrode and the second electrode serves as a lower surface of the light-emitting element 10. The upper surface of the light-emitting element 10 opposite to the lower surface serves as a main light extracting surface and is bonded to the lower surface of the light-transmissive member 35.

The light-transmissive member 35 covers the light extracting surface of the light-emitting element and is adapted to transmit, to the outside, 60% or more, preferably 70% or more, of light emitted from the light-emitting element and/or light emitted from the light-emitting element and subjected to wavelength conversion (for example, wavelengths of 320 nm to 850 nm). The light-transmissive member 35 may contain a phosphor or the like adapted to perform wavelength conversion of at least part of light emitted from the light-diffusing material or the light-emitting element 44.

The lower surface of the light-transmissive member 35 preferably has an area dimension of about 80% to 150% of the area dimension of the upper surface of the light-emitting element 44. It is preferable that the outer edges of the lower surface of the light-transmissive member 35 coincide with the outer edges of the upper surface of the light-emitting element or be located either inward or outward of the outer edge of the upper surface. That is, in a plan view, one of the upper surface of the light-emitting element and the lower surface of the light-transmissive member is preferably located inward of the other of the upper surface of the light-emitting element and the lower surface of the light-transmissive member. The light-transmissive member has a thickness in a range of, for example, 50 μm to 300 μm.

For example, the light-transmissive member 35 can be formed of resin, glass, or an inorganic substance. Examples of the light-transmissive member containing a phosphor include a sintered body of a phosphor and a mixture of a phosphor and a substance such as resin, glass, and other inorganic substances. Alternatively, a flat-plate shaped molded body of a resin, glass, or an inorganic substance provided with a resin layer containing a phosphor and/or a diffusing material on a surface of the molded body can be used. The higher the transparency of the light-transmissive member is, the more light is likely to be reflected at the interface with the covering member, so that the luminance of the light-emitting device can be improved.

Examples of the phosphor contained in the light-transmissive member 35 when using a blue or ultraviolet light-emitting element for the light-emitting element include cerium-activated yttrium-aluminum-garnet based phosphors (YAG:Ce), cerium-activated lutetium-aluminum-garnet based phosphors (LAG:Ce), europium- and/or chromium-activated nitrogen-containing calcium aluminosilicate based phosphors ($CaO-Al_2O_3-SiO_2$:Eu and/or Cr), europium-activated silicate based phosphors (such as $(Sr,Ba)_2SiO_4$:Eu), nitride phosphors such as β-SiAlON based phosphors (such as $Si_{6-z}Al_zO_zN_{8-z}$:Eu (0<Z<4.2)), CASN based phosphors, and SCASN based phosphors. KSF based phosphors ($K_2SiF_6$:Mn), sulfide based phosphors, and quantum-dot phosphors. A combination of such a phosphor and a blue or ultraviolet light-emitting element allows for obtaining a light-emitting device configured to emit light having a desired color (such as a light-emitting device configured to emit a white light). In the case in which the light-transmissive member contains such a phosphor, the concentration of the phosphor is preferably, for example, in a range of about 5% to 50%.

The light-transmissive member 35 is bonded to cover the light extracting surface of the light-emitting element. The light-transmissive member can be directly bonded to the light-emitting element by press-bonding, sintering, surface-activated bonding, atomic diffusion bonding, or hydroxy group bonding or may be bonded with an adhesive. Examples of the adhesive include known resins such as epoxy resins and silicone resins.

When the light-emitting device 30 includes the light-transmissive member 35, the covering member 34 preferably covers part or all of the lateral surfaces of the light-transmissive member 35.

The light-emitting device may include other elements or electronic components such as a protective element 36. These elements and components are preferably mounted on the substrate 33 and embedded in the covering member 34.

First Embodiment

As shown in FIGS. 1A and 1B, the light-emitting element 10 according to a first embodiment has a substantially square shape in a plan view. For example, the light-emitting element 10 with each side of 1.0 mm can be employed.

The light-emitting element 10 includes the semiconductor layered body 23, the insulating film 14, the first electrode 11, the second electrode 12, the first bumps 31, and the second bumps 32.

The semiconductor layered body 23 includes the first semiconductor layer 21, the second semiconductor layer 22, and the active layer 24 between the first semiconductor layer 21 and the second semiconductor layer 22. The first semiconductor layer 21 has the exposed portions 21a exposed from the second semiconductor layer 22 at a location inward of the outer periphery of the second semiconductor layer 22. The first semiconductor layer 21 is exposed on the outer periphery of the second semiconductor layer 22.

For example, the exposed portions 21a have a substantially circular shape, and a plurality of exposed portions 21a are disposed at substantially regular intervals in a plan view of the light-emitting element 10 on both sides of the second electrode 12 that is longer in the first direction.

The insulating film 14 defines the first openings 14a and the second openings 14b that extend through the insulating film 14 as shown in FIG. 1A to FIG. 1C. The insulating film 14 covers substantially the entire surface of the semiconductor layered body 23 except for the first openings 14a defined over the exposed portions 21a and the second openings 14b defined over the partial regions of the second semiconductor layer 22. The second openings 14b are arranged along the outer edge of the second electrode 12 facing the first electrode 11. For example, the total opening area of the first openings 14a is 4,800 μm², and the total opening area of the second openings 14b is 50,900 μm². The total opening area of the first openings is therefore smaller than the total opening area of the second openings.

In the light-emitting element 10, the light-reflective electrode 28 mainly composed of Ag is disposed over substantially the entire surface of the second semiconductor layer 22. The light-reflective electrode 28 defines the holes 28a as shown in FIG. 1E.

The first openings 14a are arranged to overlap with the holes 28a and the exposed portions 21a. That is, the exposed portions (that is, the first semiconductor layer) are exposed from the light-reflective electrode 28 in the holes 28a. The protective layer 29 composed of SiN is disposed over the second semiconductor layer 22 to cover all of surfaces of the light-reflective electrode 28, the surfaces including the upper surface, the outer peripheral lateral surfaces, and the inner lateral surfaces defining the holes 28a.

Figure 1F:
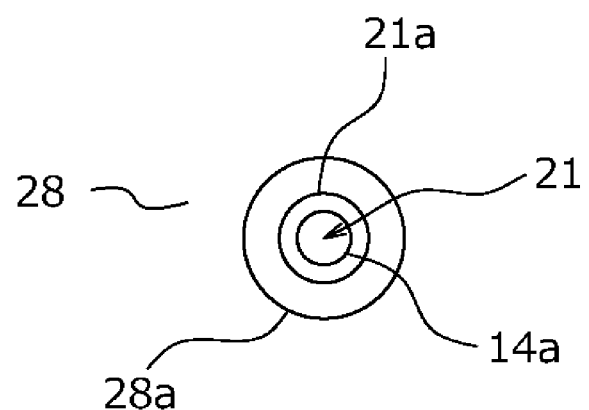
FIG. 1F is an enlarged schematic plan view of a main part for illustrating positional relationships between a first opening, an exposed portion, and a hole defined by the light-reflective electrode of the light-emitting element in FIG. 1A.

As shown in FIG. 1F, in the light-emitting element 10, each of the substantially circular holes 28a (that is, the inner peripheries of the light-reflective electrode 28 defining the holes 28a) is defined to surround a corresponding one of the substantially circular exposed portions 21a in a plan view. Each of the exposed portions 21a surrounds a corresponding one of the substantially circular first openings 14a (that is, the inner periphery of the insulating film 14 defining the first opening 14a) in a plan view.

The second openings 14b are defined over portions of the light-reflective electrode 28 that cover the second semiconductor layer 22, the portions being regions above the partial regions of the second semiconductor layer 22.

The first electrode 11 and the second electrode 12 are made of Au. The first electrode 11 is disposed on both sides with respect to the second electrode 12 in a plan view from the second semiconductor layer side as shown in FIG. 1A and FIG. 1D. More specifically, the first electrode 11 surrounds the second electrode 12 that is long in the first direction. In other words, portions of the first electrode 11 on both sides with respect to the second electrode 12 are continuous with each other through portions of the first electrode 11 at both ends of the second electrode 12 in the first direction. The first electrode 11 is electrically connected to the first semiconductor layer through each first opening 14a and is partially disposed above the second semiconductor layer 22 via the insulating film 14. The first electrode 11 collectively covers a plurality of exposed portions. The second electrode 12 is electrically connected to the second semiconductor layer 22 through the second openings 14b and partially disposed above the second semiconductor layer 22 via the insulating film 14. The second electrode collectively covers the two second openings 14b. The first electrode 11 and the second electrode 12 have a thickness of about 1 μm at a portion above the insulating film 14 above the second semiconductor layer 22. The first electrode 11 and the second electrode 12 have the first surface 11a and the second surface 12a, respectively, at the same distance (H1 and H2 in FIG. 1B) from a surface of the second semiconductor layer 22.

The first bumps 31 and the second bumps 32 are formed of Au with a thickness of 15 μm. Each first bump 31 and each second bump 32 have a circular shape with a diameter of 110 μm in a plan view and are respectively bonded to the first surface 11a and the second surface 12a. On the first electrode 11 at both sides of the second electrode 12, six-by-two first bumps 31 are disposed at uniform intervals between the exposed portions so as not to overlap with the exposed portions 21a in a plan view. Six second bumps 32 are disposed at uniform intervals on the narrow second electrode 12 along the longitudinal direction of the second electrode so as not to overlap with the second openings 14b in a plan view.

The two second openings 14b are defined on both sides of the second bumps along the longitudinal direction of the narrow second electrode. The outer edges of the second openings 14b at the second bump side are partially recessed to form substantially circular arcs corresponding to the substantially circular second bumps 32. This structure allows for facilitating disposing the second bumps on the second surface.

With such a structure, corresponding surfaces of the first bumps and the second bumps are in the same plane on the surface of the light-emitting element, and when the light-emitting element is flip-chip mounted on the substrate using the bumps, the heights of the bumps connected to electrodes with different polarities can be substantially equal to each other, so that stable flip-chip mounting can be performed. Further, with regular arrangement of the first bumps and the second bumps, imbalances in loads at the time of mounting can be reduced, so that more stable flip-chip mounting can be performed.

Second Embodiment

Figure 2A:
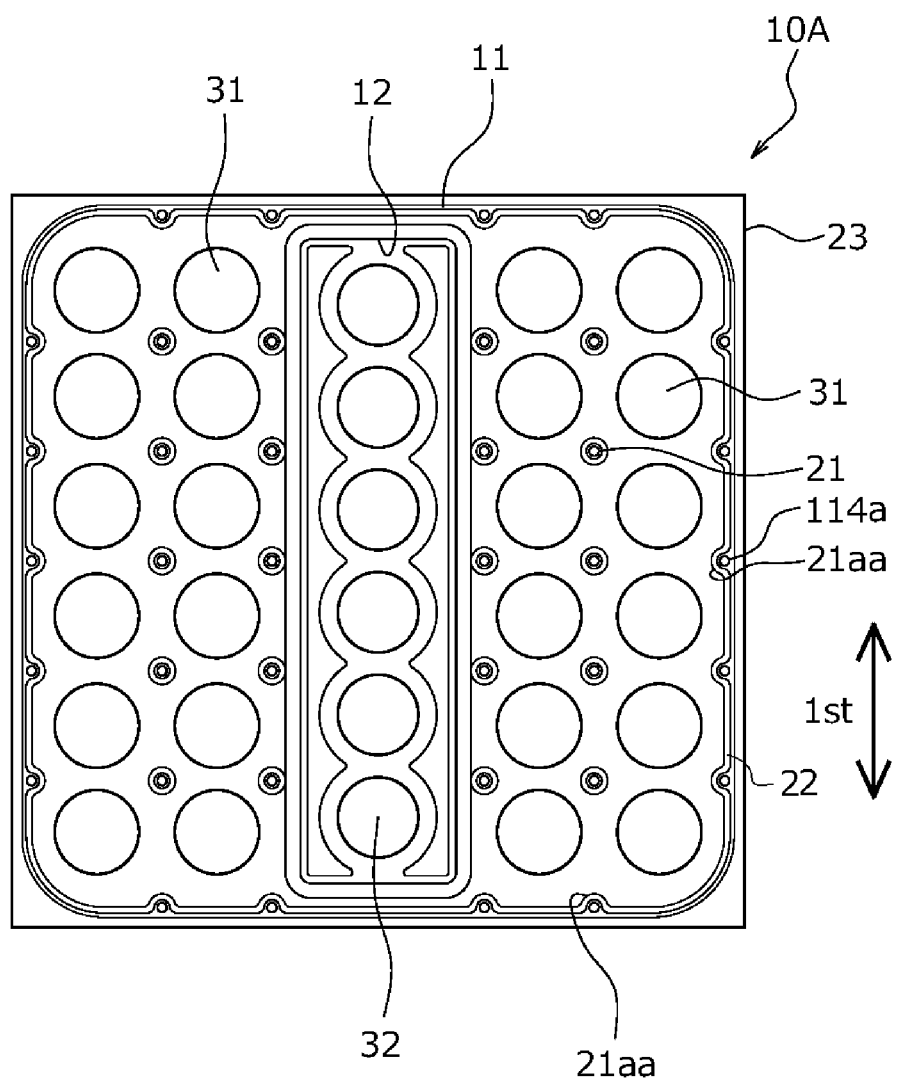
FIG. 2A is a schematic plan view of another embodiment of the light-emitting element of the present disclosure.
Figure 2B:
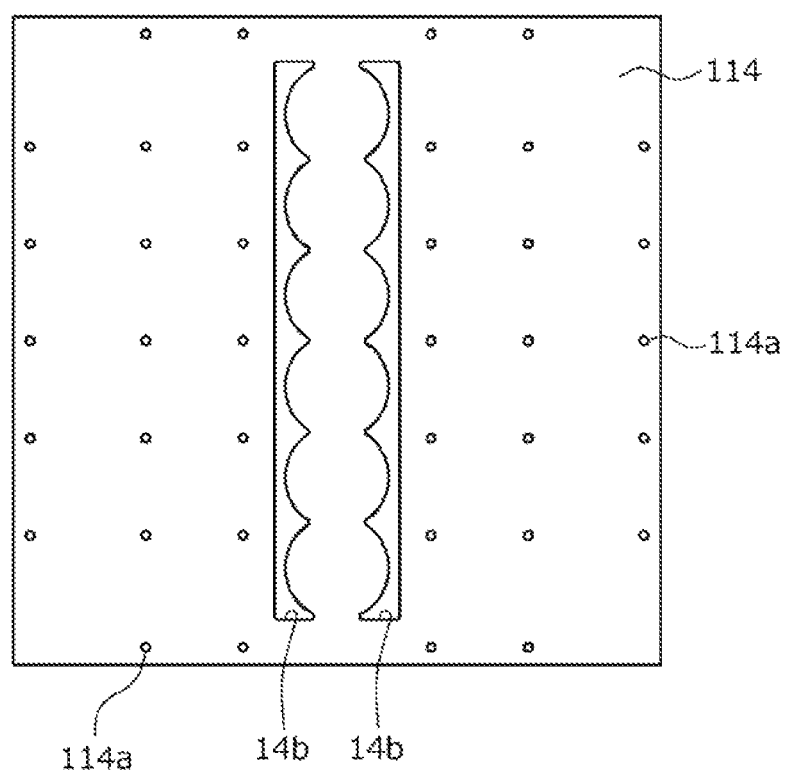
FIG. 2B is a schematic plan view for illustrating the shape of an insulating film of the light-emitting element in FIG. 2A.

The light-emitting element 10A of a second embodiment differs from the light-emitting element 10 described above in that an insulating film 114 defines first openings 114a also outward of the outer periphery of the second semiconductor layer as shown in FIG. 2A. In the light-emitting element 10A, the first openings 114a located outward of the outer periphery of the second semiconductor layer 22 are regularly arranged along the outer periphery of the second semiconductor layer 22 at certain intervals. For example, the intervals between adjacent first openings 114a are preferably 100 μm to 300 μm.

In the light-emitting element 10A of the second embodiment, the first openings 114a located inward of and outward of the outer periphery of the second semiconductor layer 22 have substantially the same circular shapes in a plan view. In order to define the substantially circular first openings outward of the outer periphery, the second semiconductor layer 22 defines outer peripheral recesses of arc-shaped recessed shape on part of the outer periphery thereof in a plan view. First openings having a substantially circular shape 114a are defined at positions corresponding to the outer peripheral recesses. With this structure, electrical connections between the first electrode 11 and the first semiconductor layer 21 can be secured also at locations outward of the outer periphery of the second semiconductor layer 22, and a decrease in the area of the second semiconductor layer 22 can be reduced.

Figure 2C:
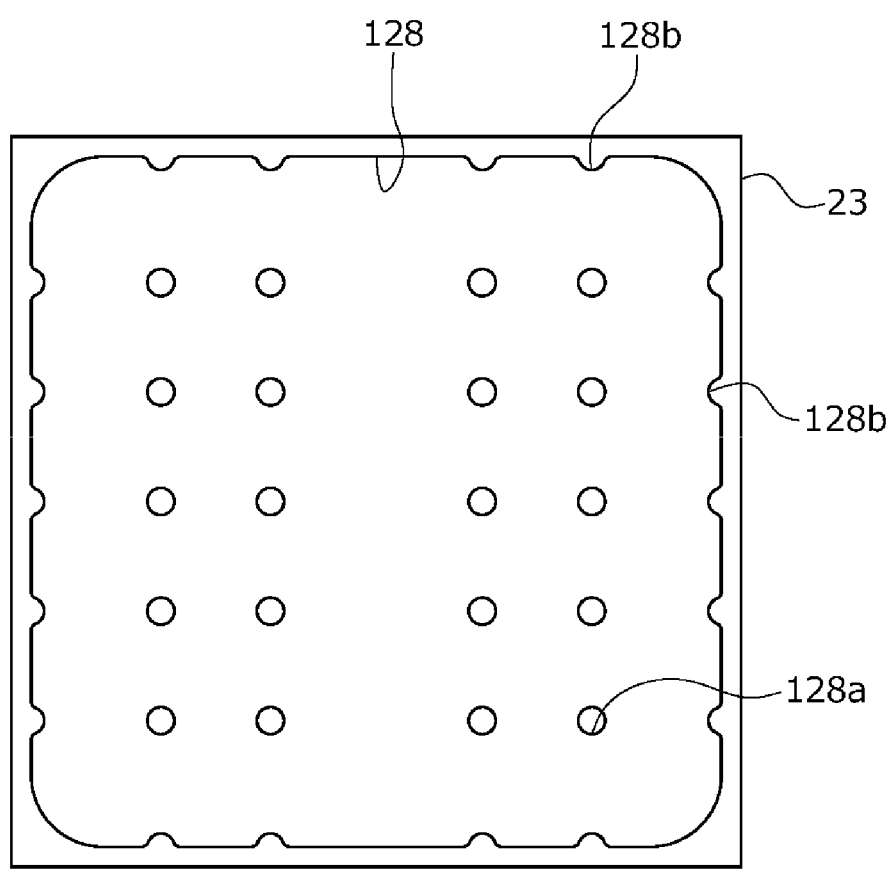
FIG. 2C is a schematic plan view for illustrating the shape of a light-reflective electrode of the light-emitting element in FIG. 2A.

Corresponding to the arrangement of the first openings 114a, for example, a light-reflective electrode 128 defines holes 128a above the exposed portions 21a. Further, the light-reflective electrode 128 also defines outer peripheral recesses 128b in its outer periphery at positions corresponding to the arrangement of the outer peripheral recesses of the second semiconductor layer 22 as shown in FIG. 2C.

Also, in the light-emitting element 10A, the first electrode 11 and the second electrode 12 respectively have the first surface 11a and the second surface 12a above the insulating film 14 over the second semiconductor layer 22, the first surface 11a and the second surface 12a located at the same distance from the surface of the second semiconductor layer 22.

On the first surface 11a of the first electrode 11 at both sides of the second electrode 12, six-by-two first bumps 31 are disposed at uniform intervals between the exposed portions 21a so as not to overlap with the exposed portions 21a in a plan view. Six second bumps 32 are disposed at uniform intervals at positions on the second surface 12a of the second electrode 12 that do not overlap with second openings 214b in a plan view. The first bumps 31 and the second bumps 32 are made of the same material and have the same thickness.

Structures other than those described above are substantially the same as those of the light-emitting element 10 of the first embodiment. Accordingly, similar effects can be obtained.

With such an arrangement of the first semiconductor layer 21 and the first openings 114a, unevenness in the current density distribution at the time of emission of light can be reduced while securing the areas of the second semiconductor layer 22 and the active layer 24.

Third Embodiment

Figure 3A:
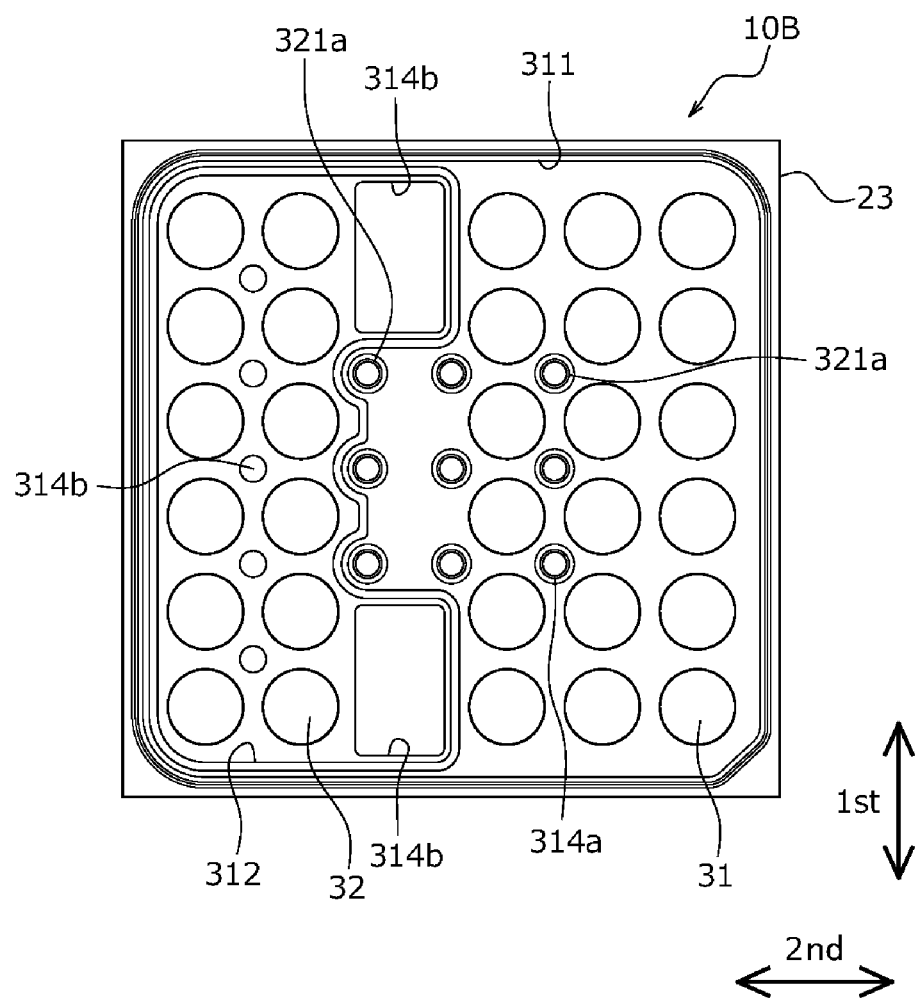
FIG. 3A is a schematic plan view of still another embodiment of the light-emitting element of the present disclosure.
Figure 3B:
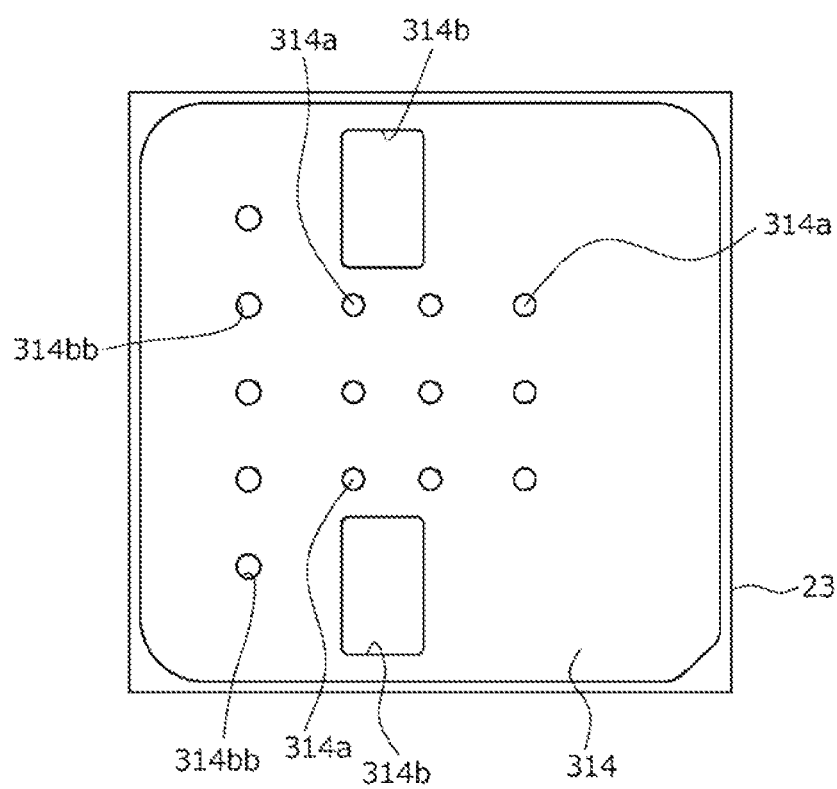
FIG. 3B is a schematic plan view for illustrating the shape of an insulating film of the light-emitting element in FIG. 3A.
Figure 3C:
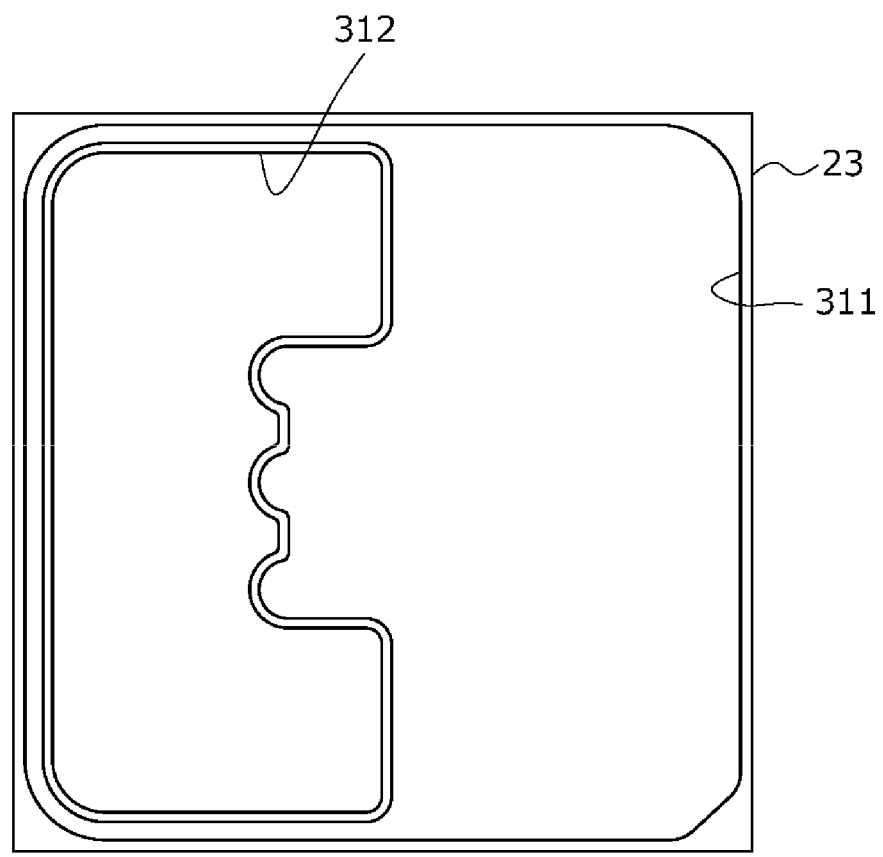
FIG. 3C is a schematic plan view for illustrating the shapes of a first electrode and a second electrode of the light-emitting element in FIG. 3A.
Figure 3D:
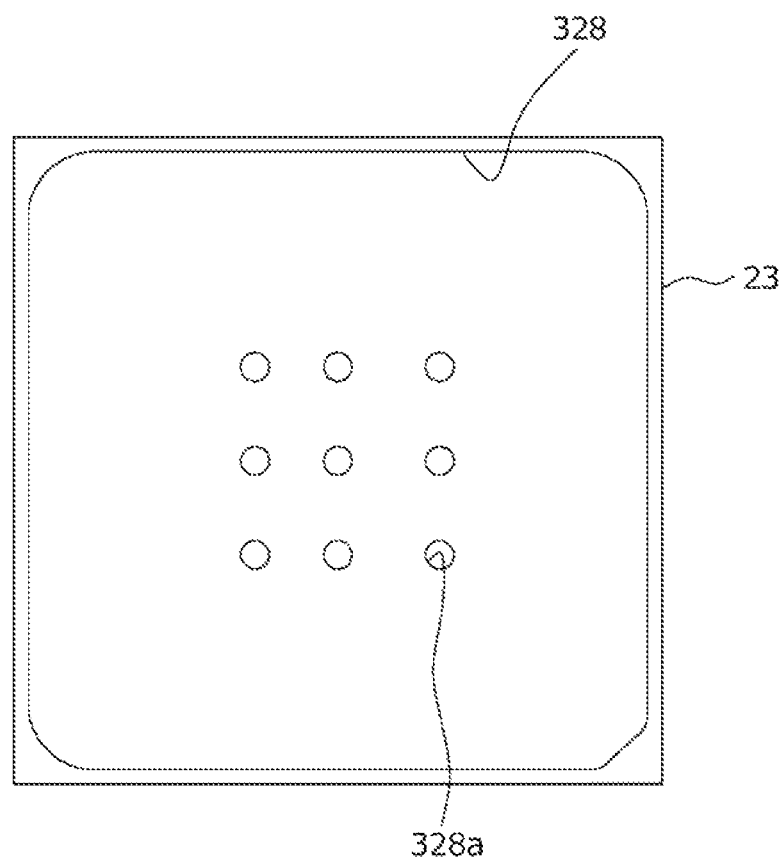
FIG. 3D is a schematic plan view for illustrating the shape of a light-reflective electrode of the light-emitting element in FIG. 3A.

As shown in FIGS. 3A and 3C, in a light-emitting element 10B of a third embodiment, a first electrode 311 and a second electrode 312 are predominantly disposed on one side and the other side, respectively, of two opposite sides of the semiconductor layered body 23 having a rectangular shape in a plan view. In a plan view, in a central portion of the light-emitting element 10B, an outer edge of the first electrode 311 facing the second electrode 312 defines a projecting region protruding toward the second electrode 312. An outer edge of the second electrode 312 facing the projecting region of the first electrode 311 is recessed to correspond to the projecting region of the first electrode 311.

On the central portion, three-by-three exposed portions 321a are arranged to overlap with the first electrode 311 and at least partially overlap with the projecting region of the first electrode 311. Each of the exposed portions 321a has a substantially circular planar shape.

As shown in FIG. 3B, first openings 314a of an insulating film 314 are arranged at the central region of the light-emitting element 10B to correspond to the arrangement of the exposed portions 321a. Two slightly larger rectangular second openings 314b are arranged on both sides of the first openings 314a at the central region. Further, five second openings 314bb, each having a substantially circular planar shape and each being slightly larger than the first opening 314a, are arranged in a row along an outer edge on the other side at which the second electrode 312 is disposed. For example, the total opening area of the first openings 314a is 9,200 μm², and the total opening area of the second openings 314b and 314bb is 68,400 μm². The total opening area of the first openings is therefore smaller than the total opening area of the second openings.

A light-reflective electrode 328 is disposed over substantially the entire surface of the second semiconductor layer 22 to be spaced apart from the end portion (including opening ends of the recesses defining the exposed portions 321a) of the second semiconductor layer 22. The light-reflective electrode 328 defines holes 328a above the exposed portions 321a. Accordingly, the second openings 314b and 314bb are defined above partial regions of the second semiconductor layer 22, that is, above partial regions of the light-reflective electrode 328. In the second openings 314b, the second electrode 312 is electrically connected to the second semiconductor layer 22 via the light-reflective electrode 328.

Also in the light-emitting element 10B, the first electrode 311 and the second electrode 312 respectively have the first surface and the second surface above the insulating film 314 above the second semiconductor layer 22, the first surface and the second surface located at the same distance from the surface of the second semiconductor layer 22.

Six-by-three first bumps 31 are disposed at uniform intervals at positions on the first surface of the first electrode 311 that do not overlap with the exposed portions 321a or the first openings 314a in a plan view. Six-by-two second bumps 32 are disposed at regular intervals at positions on the second surface of the second electrode 312 that do not overlap with the second openings 314b in a plan view. The first bumps 31 and the second bumps 32 are made of the same material and have the same thickness.

Structures other than those described above are substantially the same as those of the light-emitting element 10 of the first embodiment. Accordingly, similar effects can be obtained.

Such an arrangement of the first electrode and the second electrode causes the first bumps and the second bumps to be predominantly disposed on the one and the other sides, respectively of the light-emitting element. Even with such an arrangement, the heights of the surfaces of the first bumps 31 and the second bumps 32 respectively connected to the first surface 11a and the second surface 12a can be substantially equal to each other, so that inclination at the time of mounting can be reduced.

Fourth Embodiment

Figure 4A:
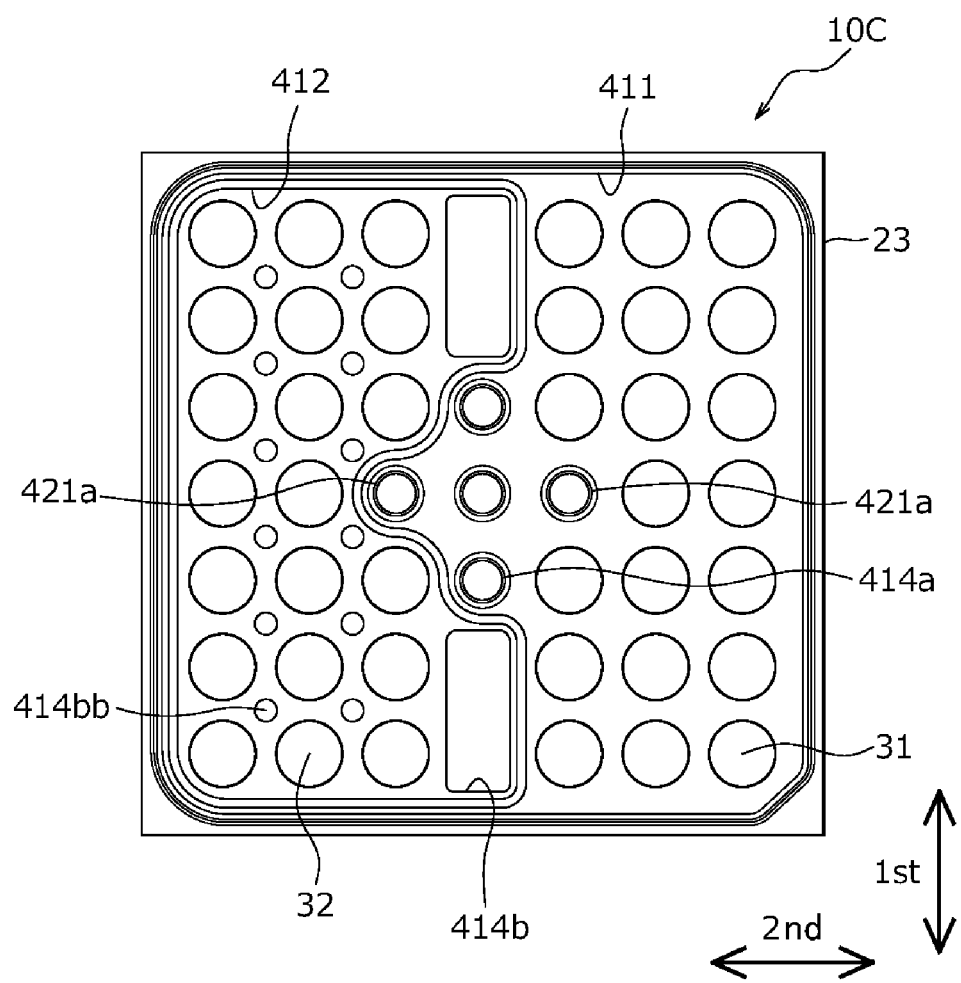
FIG. 4A is a schematic plan view of still another embodiment of the light-emitting element of the present disclosure.
Figure 4B:
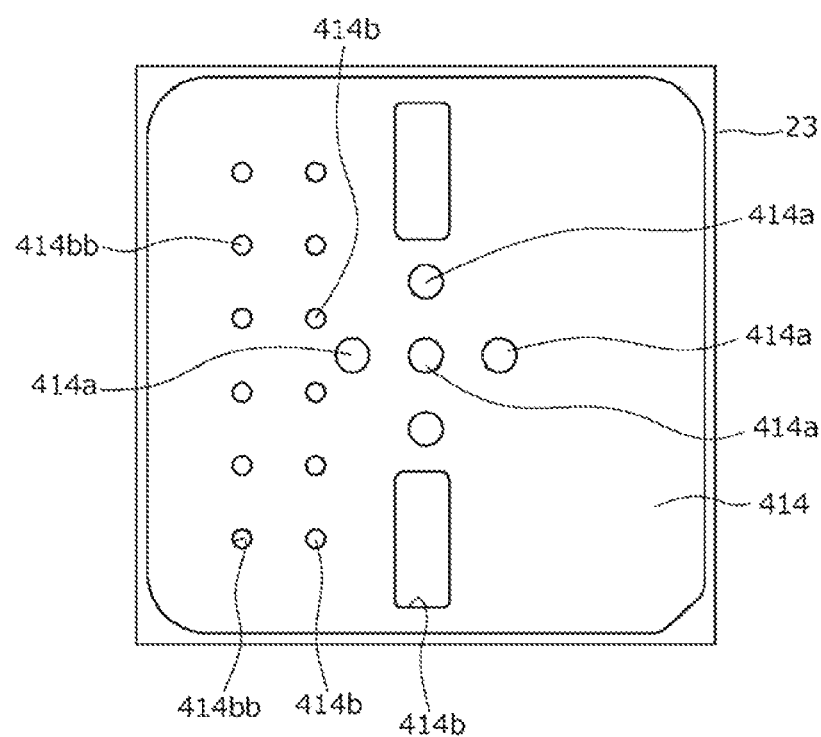
FIG. 4B is a schematic plan view for illustrating the shape of an insulating film of the light-emitting element in FIG. 4A.
Figure 4C:
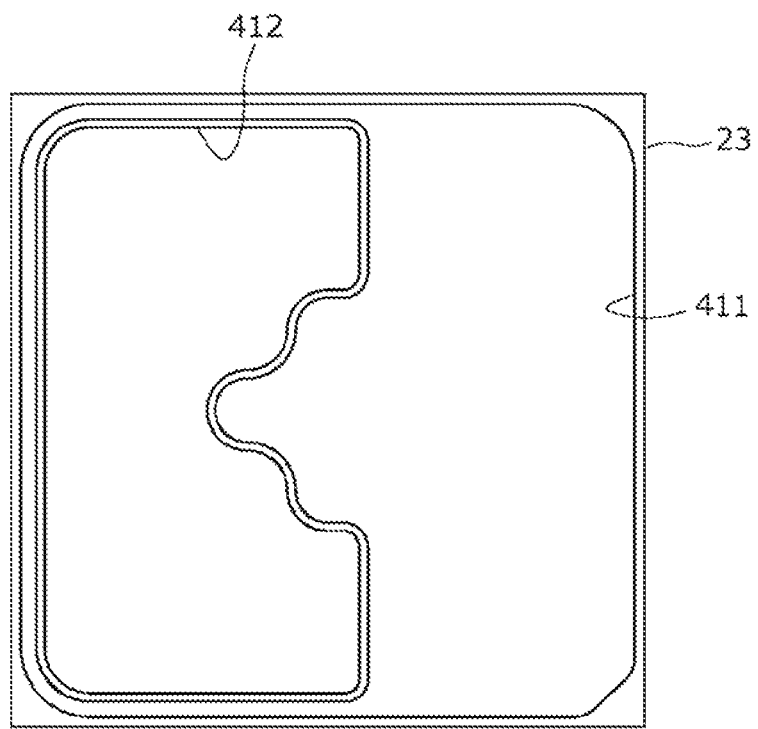
FIG. 4C is a schematic plan view for illustrating the shapes of a first electrode and a second electrode of the light-emitting element in FIG. 4A.
Figure 4D:
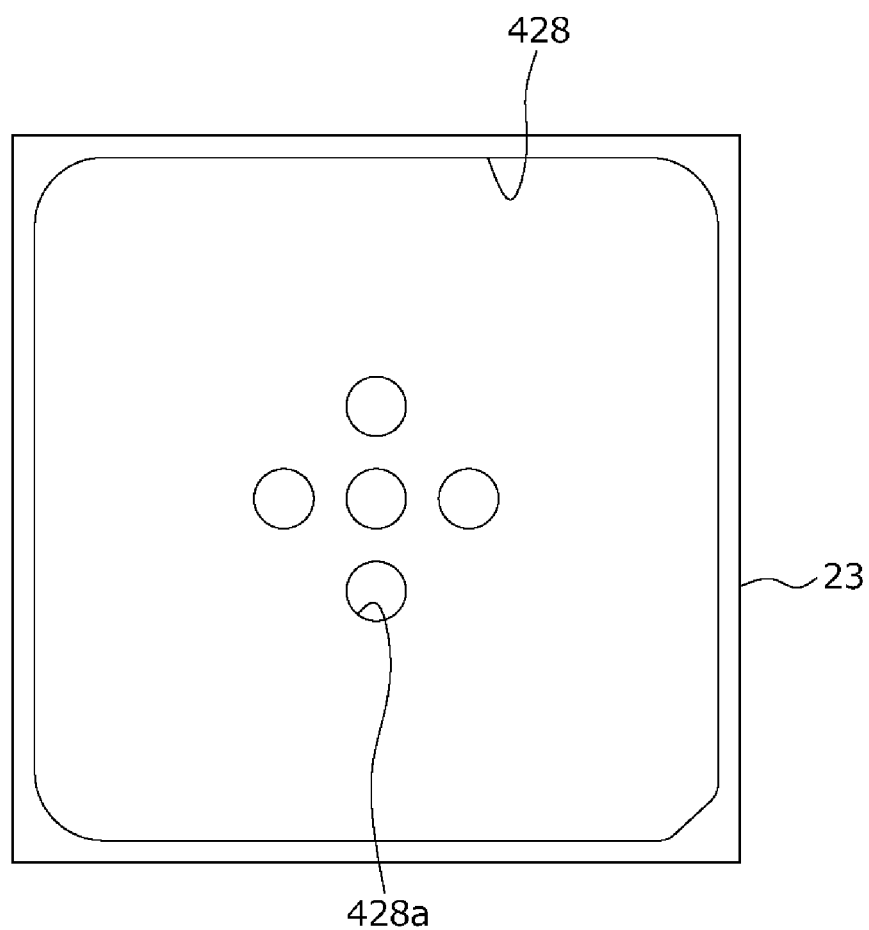
FIG. 4D is a schematic plan view for illustrating the shape of a light-reflective electrode of the light-emitting element in FIG. 4A.

In a light-emitting element 10C according to a fourth embodiment, as shown in FIGS. 4A and 4C, a first electrode 411 and a second electrode 412 are predominantly disposed on one and the other sides, respectively, of two opposite sides of the semiconductor layered body 23 having a rectangular shape in a plan view. In a central portion of the light-emitting element 10C, an outer edge of the first electrode 411 facing the second electrode 412 defines a projecting region protruding toward the second electrode 412. An outer edge of the second electrode 412 facing the projecting region of the first electrode 411 is recessed to correspond to the projecting region of the first electrode 411.

Five exposed portions 421a are arranged on the central portion to overlap with the first electrode 411 and at least partially overlap with the projecting region of the first electrode 411. Each of the exposed portions 421a has a substantially circular planar shape.

First openings 414a of an insulating film 414 are defined at a central region of the light-emitting element 10C to correspond to the arrangement of the exposed portions 421a as shown in FIG. 4B. Two slightly larger rectangular second openings 414b are defined on both sides of the first openings 414a at the center region. Further, six-by-two second openings 414bb are defined on the other side at which the second electrode 412 are disposed, each of the second openings 414bb having a substantially circular planar shape and being slightly smaller than the first opening 414a. Part of the second openings 414b are arranged along the outer edge of the second electrode 412 facing the first electrode 411. For example, the total opening area of the first openings 414a is 13,200 μm², and the total opening area of the second openings 414b and 414bb is 54,100 μm². The total opening area of the first openings is therefore smaller than the total opening area of the second openings. The first electrode 411 is electrically connected to the first semiconductor layer 21 through the first openings 414a. The second electrode 412 is electrically connected to the second semiconductor layer 22 through the second openings 414b.

Also in the present embodiment, a light-reflective electrode 428 is disposed over substantially the entire surface except for the edges of the second semiconductor layer 22. The light-reflective electrode 428 defines holes 428a above the exposed portions 421a.

Also, in the light-emitting element 10C, the first electrode 411 and the second electrode 412 respectively have the first surface and the second surface 22 above the insulating film 414 over the second semiconductor layer 22, the first surface and the second surface 22 located at the same distance from the surface of the second semiconductor layer.

Six-by-one and seven-by-two first bumps 31 are disposed at substantially uniform intervals at positions on the first surface of the first electrode 411 that do not overlap with the exposed portions 421a or the first openings 414a in a plan view. Seven-by-two and six-by-one second bumps 32 are disposed at substantially uniform intervals at positions on the second surface of the second electrode 412 that do not overlap with the second openings 414b in a plan view. The first bumps 31 and the second bumps 32 are made of the same material and have the same thickness.

Structures other than those described above are substantially the same as those of the light-emitting elements 10 and 10B. Accordingly, similar effects can be obtained.

Fifth Embodiment

Figure 5A:
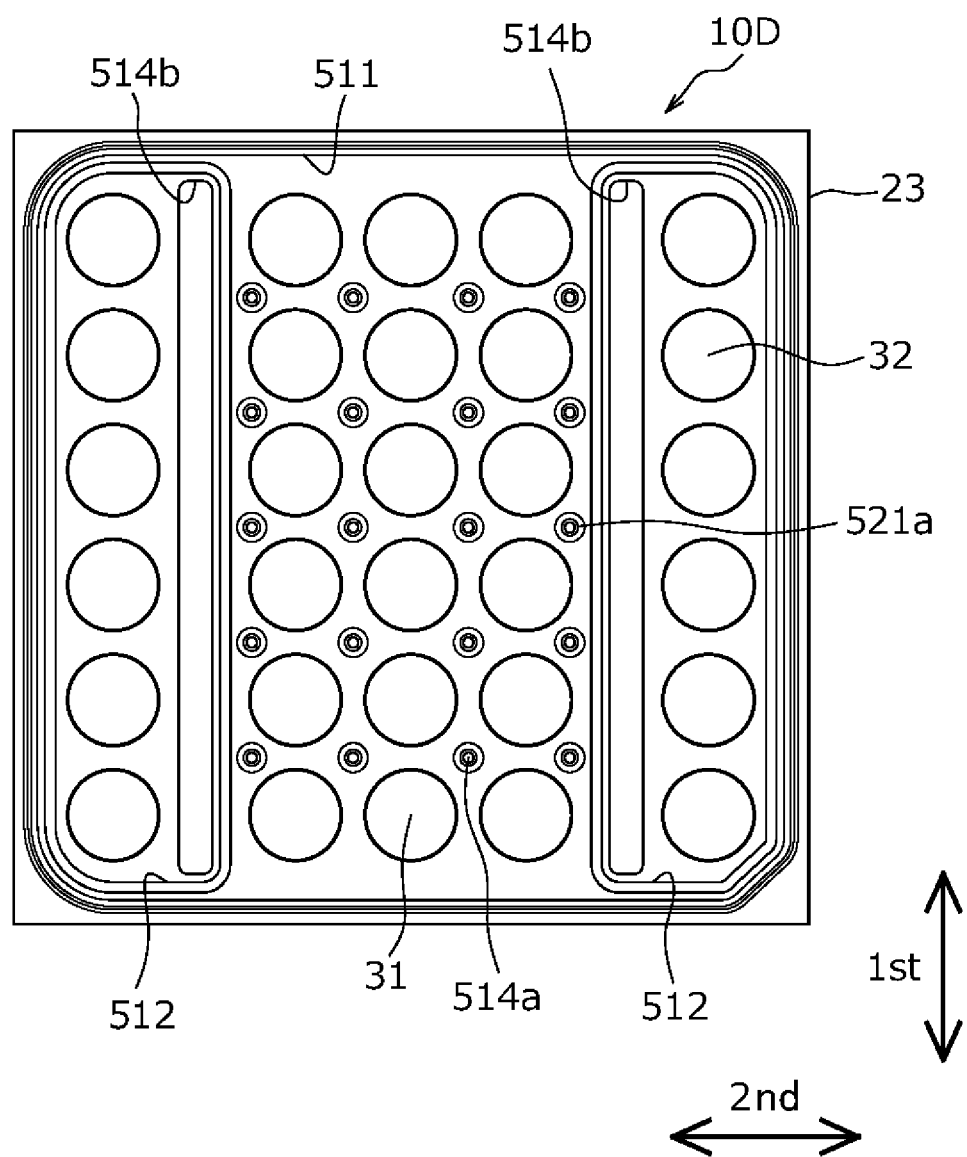
FIG. 5A is a schematic plan view of still another embodiment of the light-emitting element of the present disclosure.
Figure 5B:
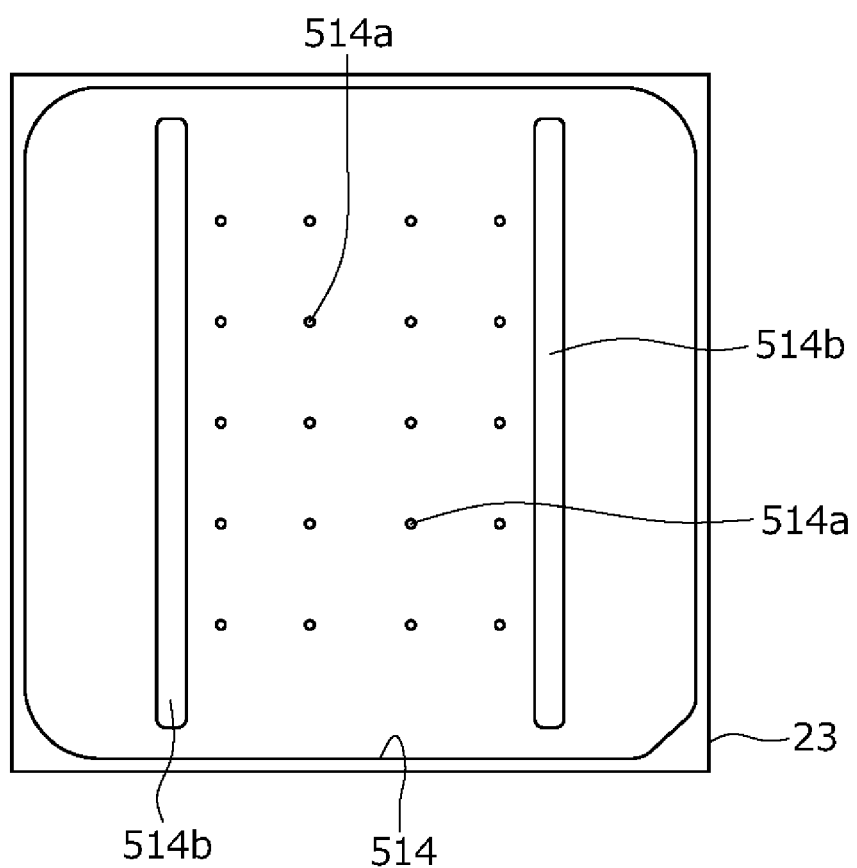
FIG. 5B is a schematic plan view for illustrating the shape of an insulating film of the light-emitting element in FIG. 5A.
Figure 5C:
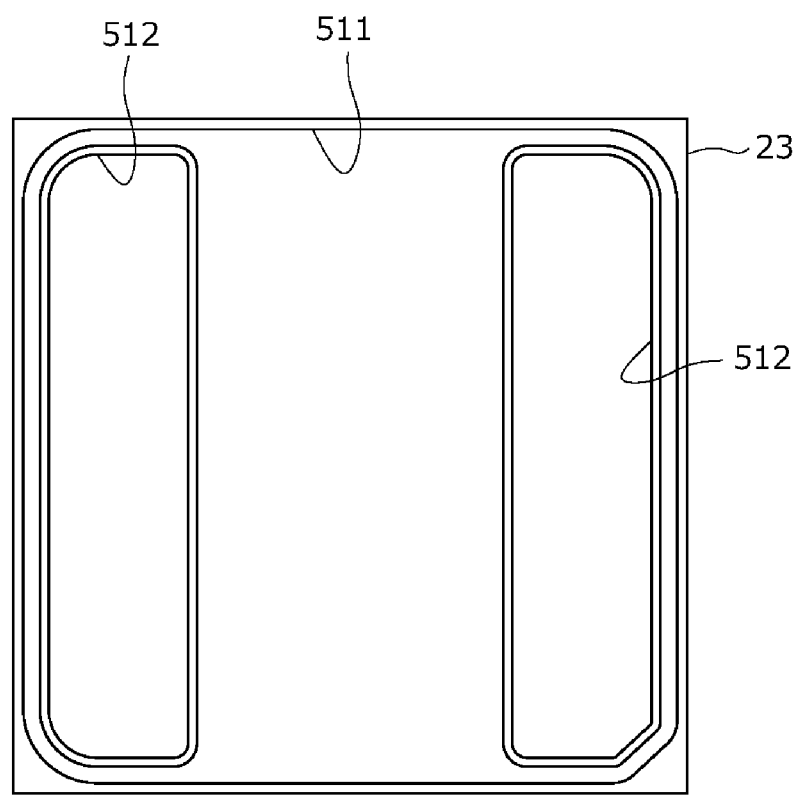
FIG. 5C is a schematic plan view for illustrating the shapes of a first electrode and a second electrode of the light-emitting element in FIG. 5A.
Figure 5D:
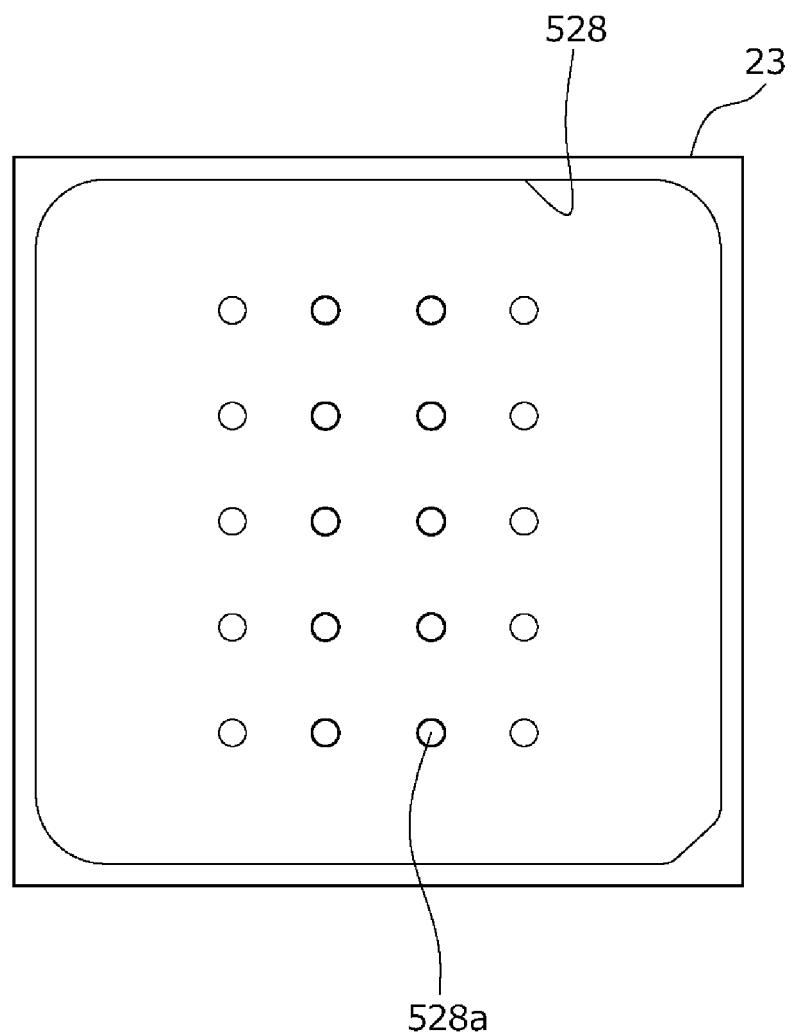
FIG. 5D is a schematic plan view for illustrating the shape of a light-reflective electrode of the light-emitting element in FIG. 5A.

A light-emitting element 10D according to a fifth embodiment includes, as shown in FIGS. 5A and 5C, second electrodes 512 of a narrow shape longer in the first direction on two opposing end portions of the semiconductor layered body 23 and a first electrode 511 disposed between the second electrodes 512 in a plan view. In other words, the second electrodes 512 are disposed on both sides with respect to the first electrode 511 in a plan view from the second semiconductor layer 22 side. The first electrode 511 surrounds the second electrodes 512 located at the two opposing end portions.

At a central region in a direction perpendicular to the first direction, five-by-four exposed portions 521a are arranged to overlap with the first electrode 511 in a plan view. Each of the exposed portions 521a has a substantially circular planar shape. Intervals between the exposed portions 521a are substantially equal to each other.

Corresponding to the arrangement of the exposed portions 521a, first openings 514a of an insulating film 514 are arranged to overlap with the exposed portions 521a in a plan view as shown in FIG. 5B. Two narrow second openings 514b are arranged on both sides of the first openings 514a along corresponding outer edges of the second electrodes. The second openings 514b are arranged along outer edges of the second electrodes 512 facing the first electrode 511. For example, the total opening area of the first openings 514a is 2,700 µm², and the total opening area of the second openings 514b is 36,600 µm². The total opening area of the first openings is therefore smaller than the total opening area of the second openings. The first electrode 511 collectively covers a plurality of exposed portions 521a and first openings 514a. The second electrodes 512 on two opposing end portions respectively cover the two second openings 514b.

A light-reflective electrode 528 is disposed over substantially the entire surface of the second semiconductor layer 22 except for the exposed portions 521a, and holes 528a are defined over the first openings 514a.

Also, in the light-emitting element 10D, the first electrode 511 and the second electrodes 512 respectively have the first surface and the second surfaces above the insulating film 514 over the second semiconductor layer 22, the first surface and the second surfaces located at the same distance from the surface of the second semiconductor layer 22.

Six-by-three first bumps 31 are disposed at positions on the first surface of the first electrode 511 at uniform intervals between the exposed portions 521a, the positions not overlapping with the exposed portions 521a or the first openings 514a in a plan view. Six second bumps 32 are disposed at positions on each second surface of the second electrodes 512 at uniform intervals in a row on both sides of the first bumps 31, the positions not overlapping with the second openings 514b in a plan view. The first bumps 31 and the second bumps 32 are made of the same material and have the same thickness.

Structures other than those described above are substantially the same as those of the light-emitting element 10 of the first embodiment. Accordingly, similar effects can be obtained.

Sixth Embodiment

Figure 6A:
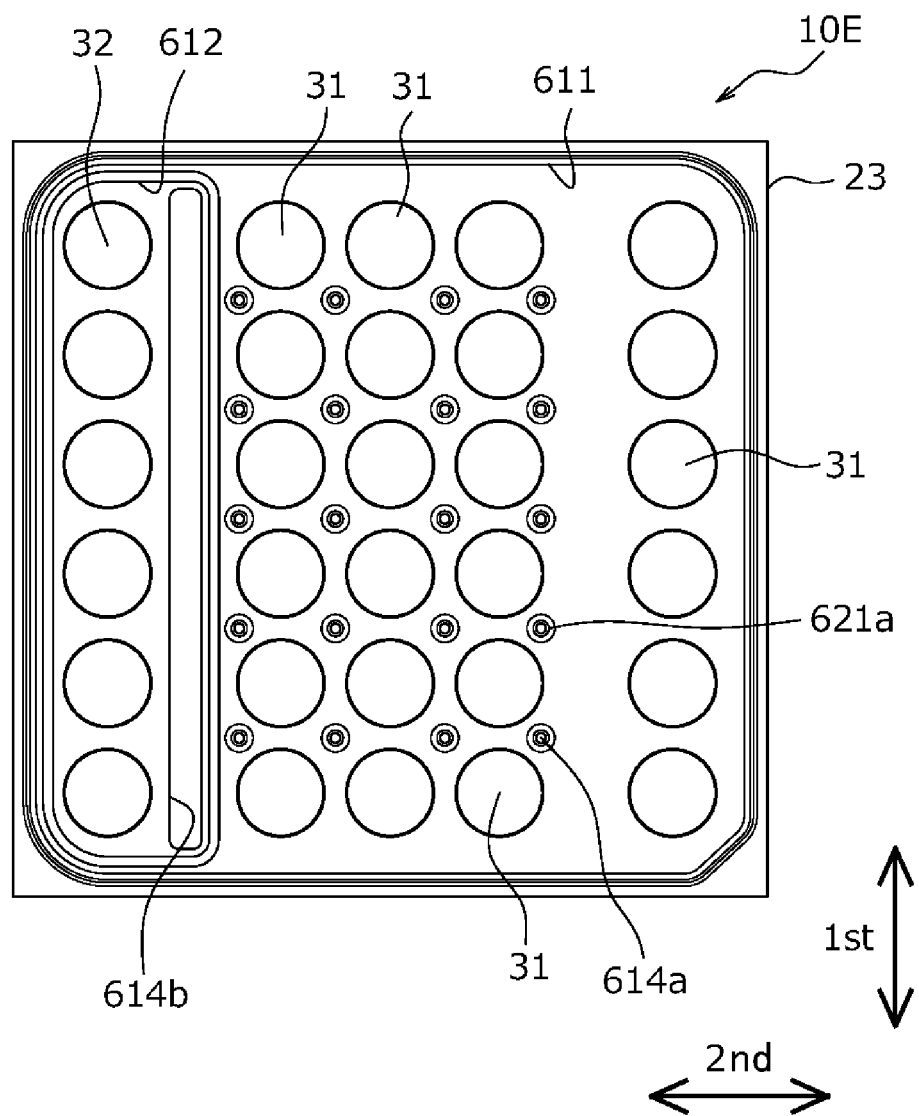
FIG. 6A is a schematic plan view of still another embodiment of the light-emitting element of the present disclosure.
Figure 6B:
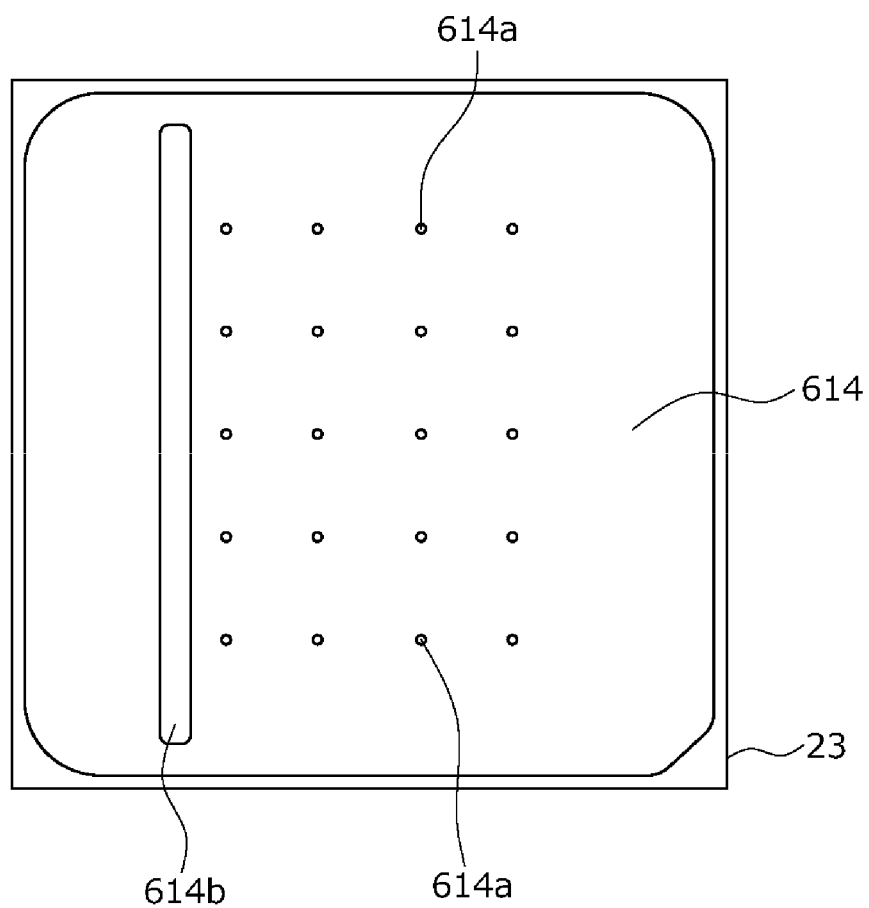
FIG. 6B is a schematic plan view for illustrating the shape of an insulating film of the light-emitting element in FIG. 6A.
Figure 6C:
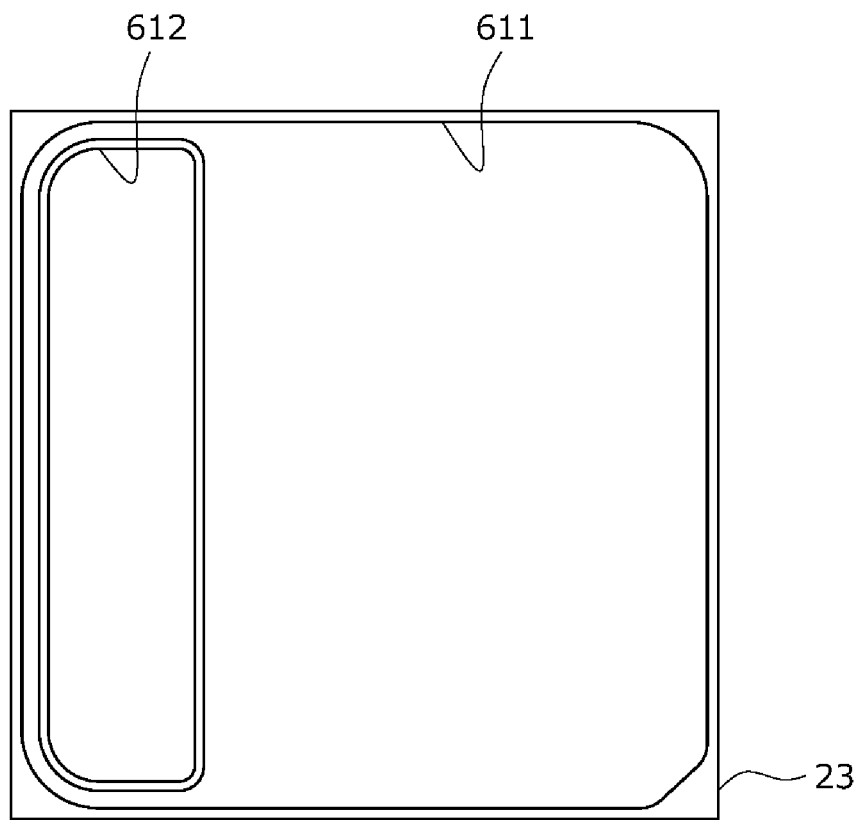
FIG. 6C is a schematic plan view for illustrating the shapes of a first electrode and a second electrode of the light-emitting element in FIG. 6A.

A light-emitting element 10E of a sixth embodiment includes the second electrode only on one side of the semiconductor layered body 23 as shown in FIGS. 6A and 6C while the light-emitting element 10D described above includes the second electrodes disposed on both sides of the semiconductor layered body 23. In other words, substantially the same structure as that of the light-emitting element 10D is employed except that a first electrode 611 and a second electrode 612 are respectively disposed on one side and the other side in a plan view from the second semiconductor layer side.

Also, in the light-emitting element 10E, the first electrode 611 and the second electrode 612 respectively have the first surface and the second surface above an insulating film 614 above the second semiconductor layer 22, the first surface and the second surface located at the same distance from the surface of the second semiconductor layer 22.

On the first surface of the first electrode 611, six-by-three first bumps 31 are disposed at uniform intervals without overlapping with the exposed portions 621a or first openings 614a in a plan view, such that each of the six-by-three first bumps 31 is located between adjacent ones of exposed portions 621a, and six first bumps 31 are disposed at uniform intervals in a row at an end portion at which the second electrode 612 is not disposed. Six second bumps 32 are arranged in a row at positions on the second surface of the second electrode 612 at uniform intervals, the positions not overlapping with second openings 614b in a plan view. The first bumps 31 and the second bumps 32 are made of the same material and have the same thickness.

Structures other than those described above are substantially the same as that of the light-emitting element 10 of the first embodiment. Accordingly, similar effects can be obtained.

The light-emitting elements of the present disclosure can be used for various light sources such as light sources for lighting, light sources for various indicators, light sources for vehicles, light sources for displays, light sources for backlights of liquid crystal screens, light sources for sensors, signals, vehicle components, and channel letters for signage.

In the description above, certain embodiments of a light-emitting element and a light-emitting device are described. However, the present invention is not limited to the description above, and should be broadly construed on the basis of the claims. The present invention also encompasses variations and modifications that are made on the basis of the description above.

What is claimed is:
1. A light-emitting element comprising:
a semiconductor layered body including a first semiconductor layer, a second semiconductor layer, and an active layer between the first semiconductor layer and the second semiconductor layer, the first semiconductor layer having a plurality of exposed portions exposed from the second semiconductor layer and the active layer at locations inward of an outer periphery of the second semiconductor layer in a plan view from a side of the second semiconductor layer;
an insulating film covering the semiconductor layered body and defining at least one first opening above one of the exposed portions and a plurality of second openings above a part of the second semiconductor layer;
a first electrode electrically connected to the first semiconductor layer through the first opening and partially located above the second semiconductor layer via the insulating film;
a second electrode electrically connected to the second semiconductor layer through the second openings and partially located above the second semiconductor layer via the insulating film;
a plurality of first bumps on the first electrode; and
a plurality of second bumps on the second electrode, the second bumps being aligned along a first direction, wherein
the first electrode has a first surface and the second electrode has a second surface above the insulating film disposed above the second semiconductor layer, the first surface and the second surface being located at a same height from the second semiconductor layer,
the first bumps are connected to the first surface, and the second bumps are connected to the second surface, in the plan view, the second electrode has an elongated shape that is longer in the first direction than in a second direction perpendicular to the first direction, in the plan view, each of the second openings has an elongated shape that is longer in the first direction and extends along an outer edge of the second electrode, with the second bumps being arranged between the second openings, and in the plan view, the second bumps overlap the insulating film.

2. The light-emitting element according to claim 1, wherein
the first bumps and the second bumps have a same thickness.

3. The light-emitting element according to claim 1, wherein
the second semiconductor layer is disposed inward of an outer periphery of the first semiconductor layer in the plan view, and
the first electrode is electrically connected to the first semiconductor layer exposed from the insulating film at a location outward of the outer periphery of the second semiconductor layer in the plan view.

4. The light-emitting element according to claim 1, wherein
the first electrode is disposed on two opposing sides with respect to the second electrode in the plan view.

5. The light-emitting element according to claim 1, wherein
the first electrode is disposed on one side, and the second electrode is disposed on another side in the plan view.

6. The light-emitting element according to claim 1, wherein
the second electrode is disposed on two opposing sides with respect to the first electrode in the plan view.

7. The light-emitting element according to claim 1, wherein
an opening area of the at least one first opening is smaller than an opening area of each of the second openings.

8. The light-emitting element according to claim 1, wherein
the semiconductor layered body has a rectangular shape in the plan view, and
the first direction is parallel to a side of the rectangular shape.

9. The light-emitting element according to claim 1, wherein
each of the second openings is arranged along the outer edge of the second electrode facing the first electrode.

10. The light-emitting element according to claim 1, wherein
the first electrode collectively covers the plurality of exposed portions.

11. The light-emitting element according to claim 1, wherein
the second electrode collectively covers the plurality of second openings arranged over the second semiconductor layer.

12. The light-emitting element according to claim 1, wherein
the second electrode is connected to the second semiconductor layer via a light-reflective electrode.

13. The light-emitting element according to claim 12, wherein
the light-reflective electrode defines holes respectively above the exposed portions.

14. The light-emitting element according to claim 1, wherein
the exposed portions are aligned along the first direction and the second direction in the plan view, and
the first bumps do not overlap the exposed portions in the first direction and in the second direction in the plan view.

15. The light-emitting element according to claim 1, wherein
a portion of a virtual line extending in the first direction and passing through at least one of the second bumps overlaps a center of the semiconductor layered body in the plan view.

16. The light-emitting element according to claim 1, wherein
an outer edge of each of the at least one second openings includes a first recessed portion recessed in an arc shape in the plan view.

17. The light-emitting element according to claim 16, wherein
the outer edge of each of the second openings further includes a second recessed portion recessed in an arc shape in the plan view and facing the first recessed portion.

18. The light-emitting element according to claim 17, wherein
at least one of the second bumps is arranged between the first recessed portion and the second recessed portion in the plan view.

19. The light-emitting element according to claim 1, wherein
the first bumps include a first portion and a second portion aligned along the second direction in the plan view, and
at least one of the second bumps is arranged between the first portion and the second portion in the plan view.

20. A light-emitting device comprising:
a substrate having an upper surface and including a first wiring and a second wiring that are disposed on the upper surface; and
a light-emitting element including
a semiconductor layered body including a first semiconductor layer, a second semiconductor layer, and an active layer between the first semiconductor layer and the second semiconductor layer, the first semiconductor layer having a plurality of exposed portions exposed from the second semiconductor layer and the active layer at locations inward of an outer periphery of the second semiconductor layer in a plan view from a side of the second semiconductor layer,
an insulating film covering the semiconductor layered body and defining a plurality of first openings respectively over the exposed portions and at least one a plurality of second openings over a part of the second semiconductor layer,
a first electrode electrically connected to the first semiconductor layer through the first openings and partially disposed above the second semiconductor layer via the insulating film, and
a second electrode electrically connected to the second semiconductor layer through the second openings and partially disposed above the second semiconductor layer via the insulating film, wherein
the first electrode has a first surface and the second electrode has a second surface above the insulating film disposed above the second semiconductor layer, the first surface and the second surface being located at a same height from the second semiconductor layer, wherein the light emitting element is flip-chip mounted on the substrate via a plurality of first bumps connecting the first surface of the first electrode and the first wiring of the substrate, and a plurality of second bumps connecting the second surface of the second electrode and the second wiring of the substrate, the second bumps being aligned along a first direction, in the plan view, the second electrode has an elongated shape that is longer in the first direction than in a second direction perpendicular to the first direction, in the plan view, each of the second openings has an elongated shape that is longer in the first direction and extends along an outer edge of the second electrode, with the second bumps being arranged between the second openings, and in the plan view, the second bumps overlap the insulating film.

* * * * *

UNITED STATES PATENT AND TRADEMARK OFFICE
CERTIFICATE OF CORRECTION

PATENT NO. : 12,336,337 B2
APPLICATION NO. : 17/489392
DATED : June 17, 2025
INVENTOR(S) : Hiroaki Kageyama Page 1 of 1

It is certified that error appears in the above-identified patent and that said Letters Patent is hereby corrected as shown below:

In the Claims

Column 24, Line 17 Claim 16:
Delete "at least one"

Column 24, Line 54 to 55 Claim 20:
Delete "at least one"

Signed and Sealed this
Fourteenth Day of October, 2025

John A. Squires
*Director of the United States Patent and Trademark Office*